US007719066B2

(12) United States Patent
Sano et al.

(10) Patent No.: US 7,719,066 B2
(45) Date of Patent: May 18, 2010

(54) ELECTROSTATIC MICRO SWITCH, PRODUCTION METHOD THEREOF, AND APPARATUS PROVIDED WITH ELECTROSTATIC MICRO SWITCH

(75) Inventors: Koji Sano, Nara (JP); Isamu Kimura, Koka (JP); Masao Jojima, Nara (JP)

(73) Assignee: OMRON Corporation, Kyoto (JP)

( * ) Notice: Subject to any disclaimer, the term of this patent is extended or adjusted under 35 U.S.C. 154(b) by 592 days.

(21) Appl. No.: 11/376,972

(22) Filed: Mar. 16, 2006

(65) Prior Publication Data

US 2006/0208328 A1 Sep. 21, 2006

(30) Foreign Application Priority Data

Mar. 18, 2005 (JP) ............................. 2005-080536

(51) Int. Cl.
*H01L 27/14* (2006.01)
*H01H 61/00* (2006.01)

(52) U.S. Cl. ........................... 257/414; 337/16; 337/38; 337/85; 337/333; 438/48; 438/49

(58) Field of Classification Search ................. 257/414; 337/16, 38, 85, 333; 438/48, 49
See application file for complete search history.

(56) References Cited

U.S. PATENT DOCUMENTS 6,662,028 B1 * 12/2003 Hayes et al. ............. 455/575.7
6,713,695 B2 3/2004 Kawai et al.
2004/0007469 A1 * 1/2004 Zhang et al. ................ 205/118
2004/0113727 A1 * 6/2004 Kawai .......................... 335/78
2005/0101054 A1 * 5/2005 Mastromatteo et al. ..... 438/106
2006/0092514 A1 * 5/2006 Koo et al. .................... 359/557
2007/0082398 A1 * 4/2007 McCabe et al. ............. 435/373

FOREIGN PATENT DOCUMENTS

EP 1 308 977 5/2003
EP 1 426 992 6/2004
JP 2003-258502 9/2003

OTHER PUBLICATIONS

Patent Abstracts of Japan; Publicatoin No. 2003-258502; Date of Publication: Dec. 9, 2003 (2 pages).
European Search Report dated Jul. 17, 2007 issued in Application No. 06111046.6-2214, 4 pages.

* cited by examiner

*Primary Examiner*—Kenneth A Parker
*Assistant Examiner*—Joseph Nguyen
(74) *Attorney, Agent, or Firm*—Osha • Liang LLP

(57) ABSTRACT

An electrostatic micro switch includes a fixed electrode disposed on a fixed substrate; a movable substrate elastically supported by the fixed substrate, the movable substrate including a movable electrode facing the fixed electrode. The movable substrate includes a semiconductor including a plurality of regions having different values of resistivity and a region of high resistivity is disposed near the movable electrode.

20 Claims, 26 Drawing Sheets

30
31

30
31

30

30
32
32

30
32
32

30

30
31

30
31

30
34
33
34
34

30

30
32
32

30
32
32

30

PRIOR ART

PRIOR ART

PRIOR ART

PRIOR ART

ELECTROSTATIC MICRO SWITCH, PRODUCTION METHOD THEREOF, AND APPARATUS PROVIDED WITH ELECTROSTATIC MICRO SWITCH

BACKGROUND OF THE INVENTION

1. Field of the Invention

A present invention relates to an electrostatic micro switch which performs switching by drive of electrostatic attraction, an electrostatic micro switch production method, and an apparatus provided with the electrostatic micro switch.

2. Description of the Related Art

An RF-MEMS (Radio Frequency Micro Electro Mechanical Systems) element which is of a conventional electrostatic micro switch will be described below with reference to FIG. 20 to FIG. 26.

FIGS. 20A and 20B show an outline of the RF-MEMS element. A RF-MEMS element 81 of FIG. 20 functions as a switching element of a coplanar line while incorporated into a high-frequency circuit. The RF-MEMS element 81 has a substrate 82. A coplanar line (CPW line) 83 which is of a line for transmitting a high-frequency signal is formed on the substrate 82. In the coplanar line 83, a signal line 83*s* is located between two ground lines 83*g*1 and 83*g*2 at certain intervals.

A movable body 84 is provided in the substrate 82. The movable body 84 is arranged above the coplanar line 83 at certain intervals while commonly facing the signal line 83*s* and parts of the ground lines 83*g*1 and 83*g*2 of the coplanar line 83. The movable body 84 is supported by the substrate 82 through beams 85 and support portions 89 such that displacement is vertically allowed with respect to the substrate 82. A movable electrode 86 is formed on a surface on the side of the substrate 82 in the movable body 84.

FIG. 21A simplistically shows an example of an arrangement relationship between the movable electrode 86 and the coplanar line 83 when viewed from above the RF-MEMS element 81, and FIG. 21B shows an example of the arrangement relationship between the movable electrode 86 and the coplanar line 83 when laterally viewed. As shown in FIG. 21, the movable electrode 86 is formed so as to stride across the ground line 83*g*1, the signal line 83*s*, and the ground line 83*g*2 of the coplanar line 83, and the movable electrode 86 faces the lines 83*s*, 83*g*1, and 83*g*2 while separated from the lines 83*s*, 83*g*1, and 83*g*2 at certain intervals.

Returning to FIGS. 20A and 20B, a protection insulating film 87 is formed on a surface of the movable electrode 86. In the substrate 82, a fixed electrode for moving 88 (88*a* and 88*b*) is formed in a region which faces the movable body 84.

In the MEMS element 81 having the above configuration, movable body displacing means for displacing the movable body 84 is formed by the movable body 84 which is of the electrode and the fixed electrodes for moving 88*a* and 88*b*. When a direct-current voltage is applied between the movable body 84 and the fixed electrode for moving 88 from the outside, electrostatic attraction is generated between the movable body 84 and the fixed electrode for moving 88. As shown in FIG. 20B, the movable body 84 is attracted toward the side of the fixed electrodes for moving 88 by the electrostatic attraction. Thus, the movable body 84 can be displaced by utilizing the electrostatic attraction with the movable body 84 and the fixed electrode for moving 88. The displacement changes an electrostatic capacitance between the movable electrode 86 and the coplanar line 83, which allows to signal conduction to be turned on and off in the coplanar line 83.

Because the MEMS element 81 having the above configuration is formed by a MEMS technology, the small, low-loss electrostatic micro switch having good high-frequency (transmission) characteristics can be realized.

The movable body 84 is made of a high-resistance semiconductor whose resistivity ranges from 1 kΩcm to 10 kΩcm. The high-resistance semiconductor shall mean a semiconductor which behaves as an insulating material for the high-frequency signal (for example, signals having frequencies not lower than about 5 GHz) while behaving as the electrode for a low-frequency signal (for example, signals having frequencies not more than about 100 kHz) and a direct-current signal. That is, the movable body 84 made of the high-resistance semiconductor has good dielectric-loss characteristics for the high-frequency signal, whereas the movable body 84 functions as the electrode for the direct-current signal (direct-current voltage).

There are the following problems in the conventional electrostatic micro switch. When the direct-current voltage is applied between the movable body 84 and the fixed electrode for moving 88 to displace the movable body 84, a depletion layer 90 (90*a* and 90*b*) is formed in a region of the movable body 84, where the movable body 84 faces the fixed electrode for moving 88.

The above phenomenon will be described in detail with reference to models shown in FIGS. 22 and 23. FIGS. 22A and 23A show models in which counterparts of the movable body 84 and the fixed electrode for moving 88 are modeled as a capacitor, and FIGS. 22B and 23B show equivalent circuits of the models respectively. In the models, a gap 91 located between the movable body 84 and the fixed electrode for moving 88 is an insulator and the movable body 84 is the semiconductor. Therefore, the models have a MIS structure (Metal Insulator Semiconductor) structure which is one of modes of the transistor.

FIGS. 22A and 22B show the state in which the direct-current voltage is not applied between the movable body 84 and the fixed electrode for moving 88. In this case, as shown in FIG. 22B, a total capacitance C of the capacitor is equal to a capacitance Co of a capacitor which is formed through the gap 91 by the movable body 84 and the fixed electrode for moving 88.

On the other hand, FIGS. 23A and 23B show the state in which the direct-current voltage is applied between the movable body 84 and the fixed electrode for moving 88. In this case, as shown in FIG. 23A, the depletion layer 90 is formed in the region of the movable body 84, where the fixed electrode for moving 88 faces the movable body 84 made of the semiconductor. This leads to the state in which the new capacitor is formed in the movable body 84, and the new capacitor and the capacitor formed through the gap 91 are connected in series as shown in FIG. 23B. Accordingly, the total capacitance of the capacitor becomes 1/C=(1/Co)+(1/Cs) and the total capacitance is decreased, so that the voltage at the gap 91 is decreased.

An expression in which the capacitance C of the MIS structure shown in FIGS. 22 and 23 is normalized by the capacitance Co is obtained as follows:

[Expression 1]

$$\frac{1}{C} = \frac{1}{C_o}\left\{1 + \sqrt{\frac{2\varepsilon_0\varepsilon_o^2}{qN_a X_o^2 \varepsilon_{Si}} V}\right\} \qquad (1)$$

Where ∈0 is a dielectric constant of vacuum, ∈o is a dielectric constant of an insulator, q is a charge amount of electron, Na is a carrier concentration, Xo is a thickness of an insulator, ∈Si is a dielectric constant of a semiconductor, and V is an applied voltage.

FIG. 24 shows a relationship between the ratio of C/Co and the applied voltage when the resistivity of a silicon semiconductor is variously changed based on the above expression (1). Referring to FIG. 24, it is found that the ratio of C/Co is decreased as the semiconductor resistivity is increased. That is, when the resistivity is high, the depletion layer is increased and the capacitance Cs is also increased. Therefore, the voltage drop at the gap 91 by the capacitance Cs is increased as the resistivity is increased. Accordingly, in order to perform the desired operation of the movable body 84 which is of the high-resistance semiconductor, it is necessary that the high direct-current voltage be applied between the movable body 84 and the fixed electrode for moving 88 when compared with the case where the movable body 84 is made of the low-resistance semiconductor.

FIG. 25 shows the equivalent circuit of the state in which a direct-current power supply 92 applies the voltage between the movable body 84 and the fixed electrode for moving 88. In FIG. 25, R is a resistance of the movable body 84, vc is a terminal voltage of the capacitor, vR is a terminal voltage of the resistance, and ic is a current passed through the movable body 84.

Because the circuit shown in FIG. 25 becomes an RC circuit, the following expression holds.

[Expression 2]

$$v_C = V\left(1 - \varepsilon^{-\frac{t}{CR}}\right) \quad (2)$$

Where ∈ is a base of a natural logarithm and t is time. As can be seen from the expression (2), the time t during which the voltage vc is brought close to the applied voltage V is lengthened, when a product of the resistance R and the capacitance C is increased.

FIG. 26 is a graph showing the relationship between resistance R and time t, in which a terminal voltage vc of the capacitor becomes V, when the capacitance C of the capacitor is set at 1 μF in the equivalent circuit shown in FIG. 25. As can be seen from FIG. 26, a charging time to the capacitance is lengthened as the resistance R is increased. That is, the charging time to the capacitor is lengthened, when the resistivity of the semiconductor which is of the movable body 84 is increased.

When the direct-current voltage is applied between the movable body 84 and the fixed electrode for moving 88, the movable body 84 is brought close to the fixed electrode for moving 88, which increases the capacitance C of the capacitor. Therefore, the charging time to the capacitor is further lengthened, which decreases an operation speed of the electrostatic micro switch.

In order to avoid the above problems, it is thought that the resistivity of the movable body 84 is decreased. However, in this case, transmission characteristics of the high-frequency signal are lowered.

SUMMARY OF THE INVENTION

Embodiments of the present invention provide an electrostatic micro switch in which drive voltage rise and operation speed lowering are never generated while the high-frequency characteristics are maintained.

In accordance with one aspect of the present invention, an electrostatic micro switch comprises a fixed electrode which is provided in a fixed substrate; a movable substrate which includes a movable electrode, the movable electrode being arranged while facing the fixed electrode, the movable substrate being elastically supported by the fixed substrate; a fixed-side signal conducting unit which is provided in the fixed substrate; and a movable-side signal conducting unit which provided in the movable substrate, the movable-side signal conducting unit displacing the movable substrate by electrostatic attraction between the movable electrode and the fixed electrode to perform switching between the movable-side signal conducting unit and the fixed-side signal conducting unit, wherein the movable substrate is made of a semiconductor including a plurality of regions having different values of resistivity; at least a portion where the movable-side signal conducting unit is provided and a portion which faces the fixed-side signal conducting unit have high resistivity in the movable substrate; and at least a part of the movable electrode has low resistivity.

An embodiment of the present invention, at least the portion where the movable-side signal conducting unit is provided, the portion which faces the fixed-side signal conducting unit, and peripheral portions of the portions have the high resistivity in the movable substrate.

An embodiment of the present invention, the peripheral portions cover outsides which are at least 100 μm away from the portion where the movable-side signal conducting unit is provided and the portion which faces the fixed-side signal conducting unit in the movable substrate respectively.

An embodiment of the present invention, the movable substrate is formed by bonding a low-resistivity semiconductor substrate provided with the movable electrode and a high-resistivity semiconductor substrate provided with the movable-side signal conducting unit.

An embodiment of the present invention, the low-resistivity region of the movable electrode is formed by doping.

An embodiment of the present invention, the high resistivity is not lower than 800 Ωcm.

An embodiment of the present invention, the low resistivity is not more than 300 Ωcm.

In accordance with one aspect of the present invention, a radio communication device comprises an antenna; an internal processing circuit; and an electrostatic micro switch which is connected between the antenna and the internal processing circuit, the electrostatic micro switch comprising a fixed electrode which is provided in a fixed substrate; a movable substrate which includes a movable electrode, the movable electrode being arranged while facing the fixed electrode, the movable substrate being elastically supported by the fixed substrate; a fixed-side signal conducting unit which is provided in the fixed substrate; and a movable-side signal conducting unit which provided in the movable substrate, the movable-side signal conducting unit displacing the movable substrate by electrostatic attraction between the movable electrode and the fixed electrode to perform switching between the movable-side signal conducting unit and the fixed-side signal conducting unit, wherein the movable substrate is made of a semiconductor including a plurality of regions having different values of resistivity; at least a portion where the movable-side signal conducting unit is provided and a portion which faces the fixed-side signal conducting unit have high resistivity in the movable substrate; and at least a part of the movable electrode has low resistivity.

In accordance with one aspect of the present invention, an electrostatic micro switch production method comprises the steps of: providing a fixed electrode and a fixed-side signal conducting unit in a fixed substrate; forming a movable substrate which is formed with a low-resistivity region in a part of a high-resistivity semiconductor substrate and is made of a semiconductor including a plurality of regions having different values of resistivity; providing a movable-side signal conducting unit in the movable substrate; and bonding integrally the movable substrate to the fixed substrate.

An embodiment of the present invention, the low-resistivity region is formed to form the movable substrate by performing doping into a region which faces the fixed electrode of the high-resistivity semiconductor substrate in the step of forming the movable substrate.

An embodiment of the present invention, the region which faces the fixed electrode of the high-resistivity semiconductor substrate is removed and a low-resistivity semiconductor film is formed to form the movable substrate in the removed region in the step of forming the movable substrate.

BRIEF DESCRIPTION OF THE DRAWINGS

FIG. 11 shows a model utilized for a simulation for studying a frequency of signal to be turned on and off and the insertion loss when a width of a high-resistivity region is changed in the electrostatic micro switch.

FIG. 14 shows a structure of an electrostatic micro switch according to another embodiment of the invention.

FIG. 15 shows a structure of an electrostatic micro switch according to still another embodiment of the invention.

FIG. 16 shows a structure of an electrostatic micro switch according to still another embodiment of the invention.

FIG. 20 schematically shows a sectional view of a conventional RF-MEMS element.

FIG. 21 simplistically shows of an example of arrangement relationship between a movable electrode and a coplanar line in the conventional RF-MEMS element.

DETAILED DESCRIPTION OF THE INVENTION

First Embodiment

Figure 1:
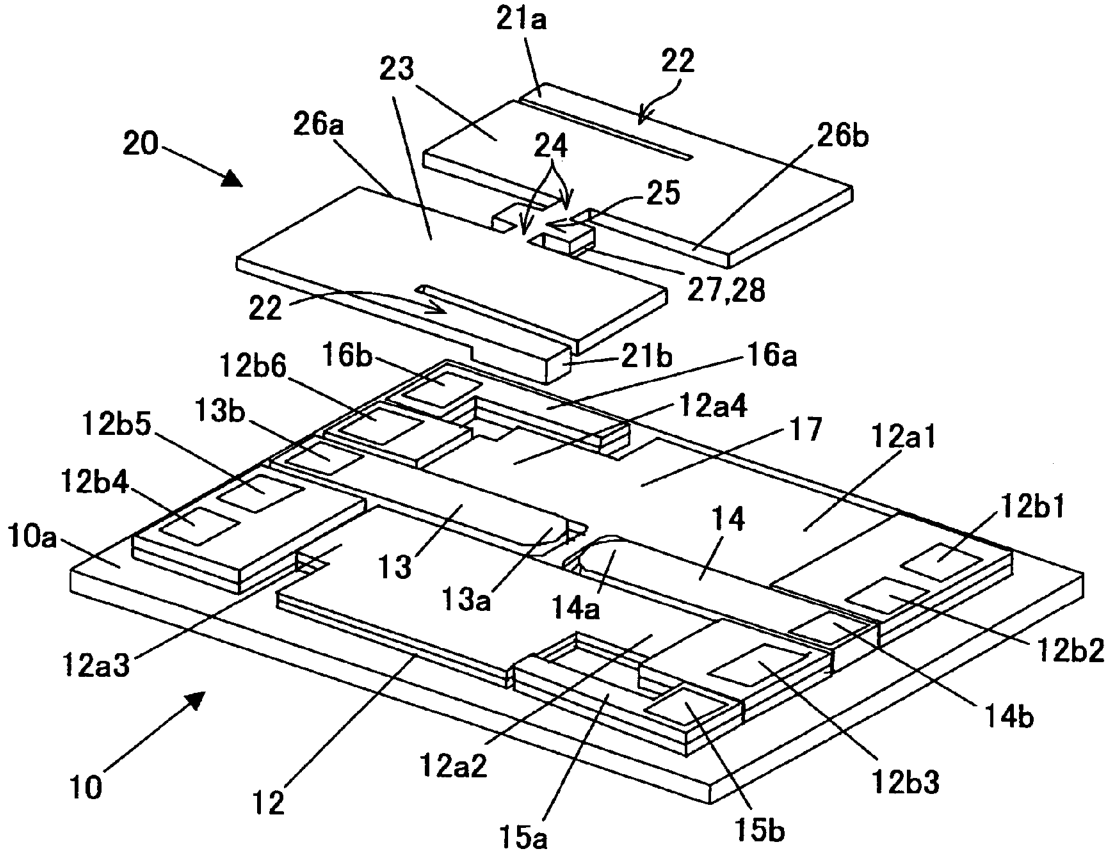
FIG. 1 shows an exploded view of a structure of an electrostatic micro switch according to an embodiment of the invention.
Figure 2:
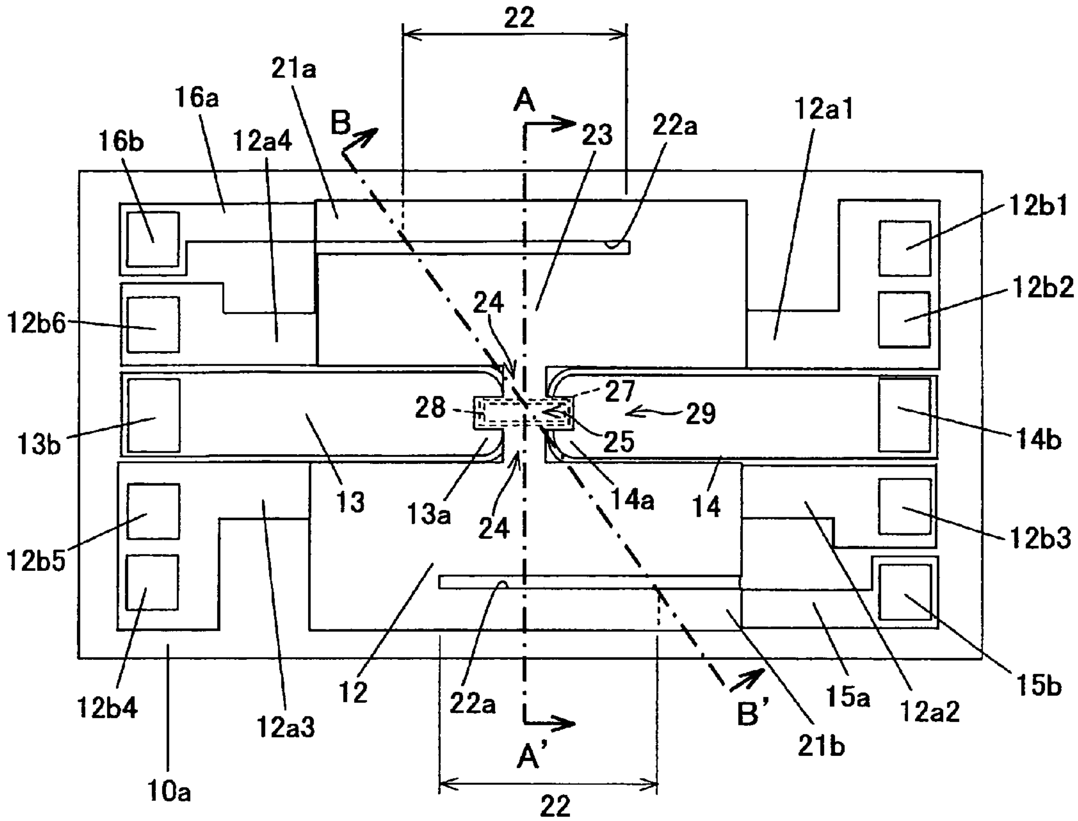
FIG. 2 shows a plan view of the electrostatic micro switch.
Figure 3:
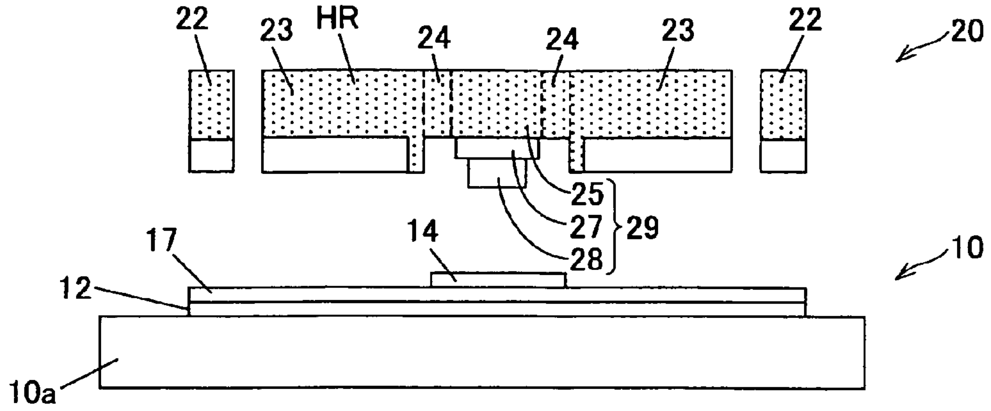
FIG. 3 shows a sectional view taken on line A-A' of FIG. 2.
Figure 4:
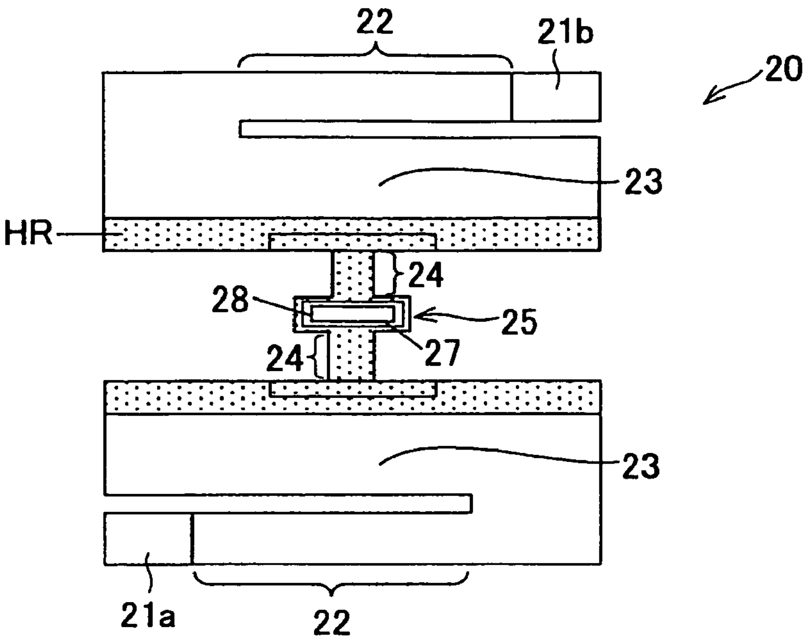
FIG. 4 shows a lower surface view of a movable substrate in the electrostatic micro switch.

A first embodiment of the invention will be described below with reference to FIGS. 1 to 13. FIGS. 1 to 3 show a structure of an electrostatic micro switch according to the first embodiment. FIG. 1 is an exploded view showing the structure of an electrostatic micro switch of the first embodiment, FIG. 2 shows a plan view, and FIG. 3 shows a sectional view taken on line A-A' of FIG. 2. FIG. 4 shows a bottom surface view of a movable substrate in the electrostatic micro switch. In the drawings, the same component is designated by the same numeral.

An electrostatic micro switch 1 is one in which a movable substrate 20 is integrated with an upper surface of a fixed substrate 10. In the fixed substrate 10, a fixed electrode 12 and two signal lines (fixed-side signal conducting unit) 13 and 14 are provided on the upper surface of a glass substrate 10*a*. The surface of the fixed electrode 12 is coated with an insulating film 17. The fixed electrode 12 is connected to connection pads 12*b*1 and 12*b*2 through interconnect 12*a*1, the fixed electrode 12 is connected to a connection pad 12*b*3 through an interconnect 12*a*2, the fixed electrode 12 is connected to connection pads 12*b*4 and 12*b*5 through an interconnect 12*a*3, and the fixed electrode 12 is connected to an connection pad 12*b*6 through an interconnect 12*a*4. The signal lines 13 and 14 are arranged in the same straight line. End portions of the signal lines 13 and 14, which are opposite each other, form fixed contacts 13*a* and 14*a* which are provided at predetermined intervals, and the other ends are connected to connection pads 13*b* and 14*b* respectively.

The fixed electrodes 12 are formed on both sides of the signal lines 13 and 14 with predetermined intervals, and the fixed electrodes 12 are also used as a high-frequency GND electrode, which forms a coplanar structure. The fixed electrodes 12 and 12 located on both the sides of the signal lines 13 and 14 are connected to each other between fixed contacts 13*a* and 14*a* of the signal lines 13 and 14. Because electric flux lines generated by a switching signal are terminated at the high-frequency GND electrode located between the fixed contacts 13*a* and 14*a*, isolation characteristics is improved. The upper surfaces of the fixed electrodes 12 and 12 are formed so as to be lower than the upper surfaces of the signal lines 13 and 14.

The movable substrate 20 is formed by a substantially rectangular plate-shaped semiconductor substrate. In the movable substrate 20, movable electrodes 23 and 23 are elastically supported through first elastic support portions 22 and 22 by anchors 21*a* and 21*b*. In a central portion of the movable substrate 20, a contact setting portion 25 is elastically supported through second support portions 24 and 24 by the anchors 21*a* and 21*b*. A silicon substrate can be cited as an example of the semiconductor substrate.

The anchors 21*a* and 21*b* are vertically provided at two points on the upper surface of the fixed substrate 10. The anchors 21*a* and 21*b* are electrically connected to connection pads 16*b* and 15*b* through interconnects 16*a* and 15*a* provided on the upper surface of the fixed substrate 10 respectively. The first elastic support portions 22 and 22 are formed by slits 22*a* and 22*a* provided along both side-end portions of the movable substrate 20, and the first elastic support portions 22 and 22 are integrated with the anchors 21*a* and 21*b* at the lower surfaces of the end portions.

The movable electrode 23 facing the fixed electrode 12 is attracted to the fixed electrode 12 by the electrostatic attraction which is generated by applying the voltage between the electrodes 12 and 23. The second support portions 24 and 24 and the contact setting portion 25 are formed by notch portions 26*a* and 26*b* which are provided toward the central portion from the centers of the both side-end portions of the movable substrate 20. In the movable electrode 23, portions which face at least the signal lines 13 and 14 are removed because of the notch portions 26*a* and 26*b*.

The second support portions 24 and 24 are narrow beams which couple the contact setting portion 25 and the movable electrodes 23 and 23. The second support portions 24 and 24 are configured to obtain elastic force larger than the first elastic support portions 22 and 22 in closing the contact. The contact setting portion 25 is supported by the second support portions 24 and 24, and a movable contact (movable-side signal conducting unit) 28 is provided in the lower surface of the contact setting portion 25 through an insulating film 27. A movable contact unit 29 includes the contact setting portion 25, the insulating film 27, and the movable contact 28. The movable contact 28 faces the fixed contacts 13*a* and 14*a*, and the movable contact 28 performs the closing to the fixed contacts 13*a* and 14*a* to electrically connect the signal lines 13 and 14.

In the first embodiment, as shown in FIGS. 3 and 4, the region which faces the fixed electrode 12 of the fixed substrate 10 is a low-resistivity region in the lower surface of the movable substrate 20 made of the semiconductor, i.e., in the surface side on which the fixed substrate 10 is arranged. Therefore, the generation of the depletion layer can be suppressed in the region facing the fixed electrode 12 and the drive voltage rise can be avoided. Since the region of the movable substrate 20 has the low resistivity, the operation speed lowering can be suppressed.

The regions except for the region facing the fixed electrode 12, i.e., the regions near the signal lines 13 and 14 through which the high-frequency signal is passed are a high-resistivity region HR. Therefore, the insertion loss can be decreased to maintain the good high-frequency characteristics.

The control of the semiconductor resistivity can be realized by selectively doping a need amount of impurity by ion implantation or diffusion only into a portion where the resistivity is changed in the semiconductor substrate having certain resistivity.

In the case of the electrostatic micro switch 1 having the structure shown in FIGS. 1 to 4, it is desirable that the electrostatic attraction be generated more evenly in planes facing each other in the movable electrode 23 and fixed electrode 12 when the voltage is applied between the movable electrode 23 and the fixed electrode 12. Therefore, it is desirable that the voltage be applied to both the connection pads 15*b* and 16*b* of the fixed substrate 10 electrically connected to the movable electrode 23. The reason will be described below with reference to FIGS. 5 and 6.

Figure 5:
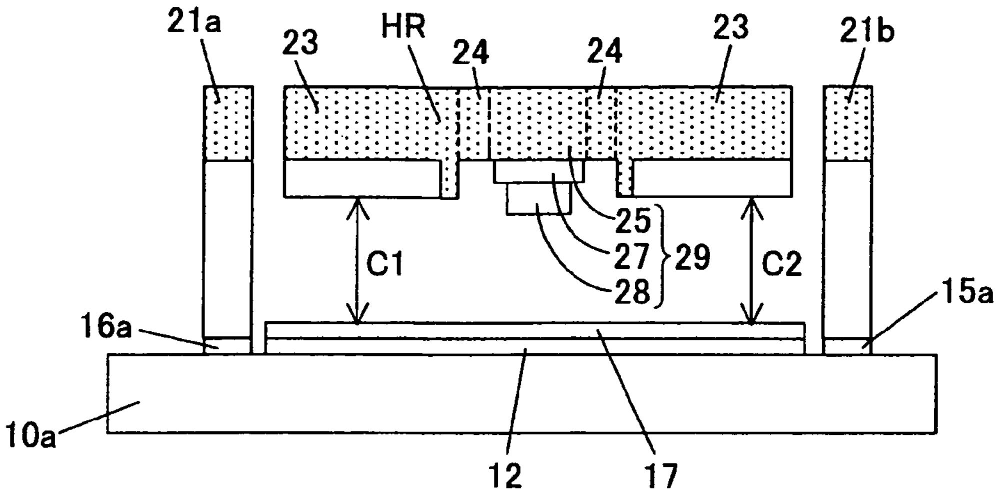
FIG. 5 shows a sectional view taken on line B-B' of FIG. 2.

FIG. 5 shows a sectional view taken on line B-B' of FIG. 2. In the first embodiment, the fixed electrodes 12 and 12 located on the both sides of the signal lines 13 and 14 are connected to each other between the fixed contacts 13*a* and 14*a*. For the capacitor formed by the movable electrodes 23 and 23 and the fixed electrodes 12 and 12, as shown in FIG. 5, a capacitor C1 exists on the side of the anchor 21*a* and a capacitor C2 exists on the side of the anchor 21*b*.

Figure 6A:
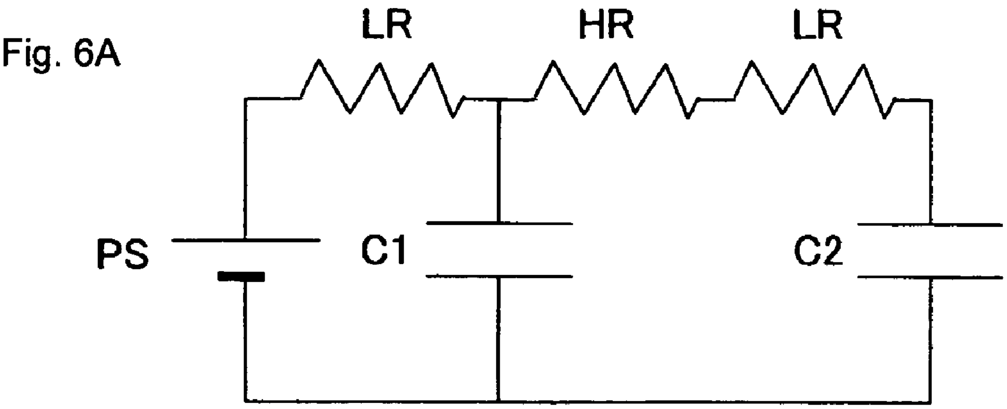
FIG. 6A shows an equivalent circuit when a voltage is applied between a fixed electrode and one connection pad.
Figure 25:
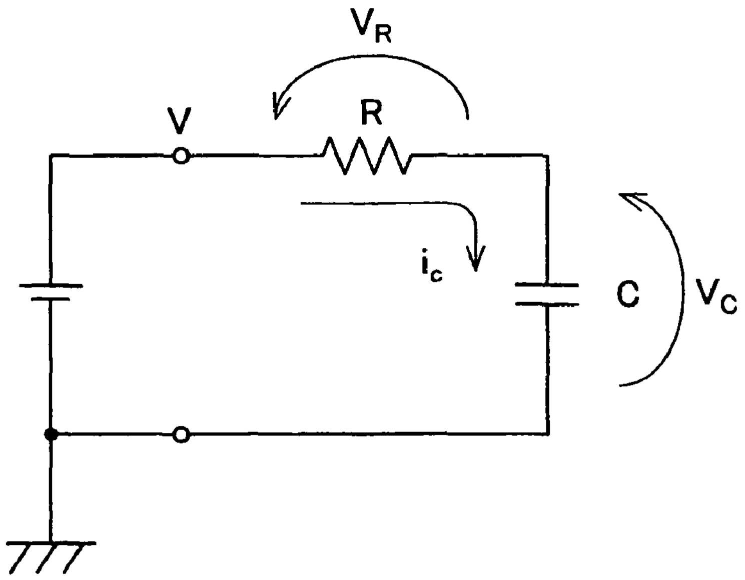
Fig. 25 PRIOR ART
FIG. 25 shows an equivalent circuit of a state in which a power supply applies the voltage between the movable body and the fixed electrode for moving.
Figure 26:
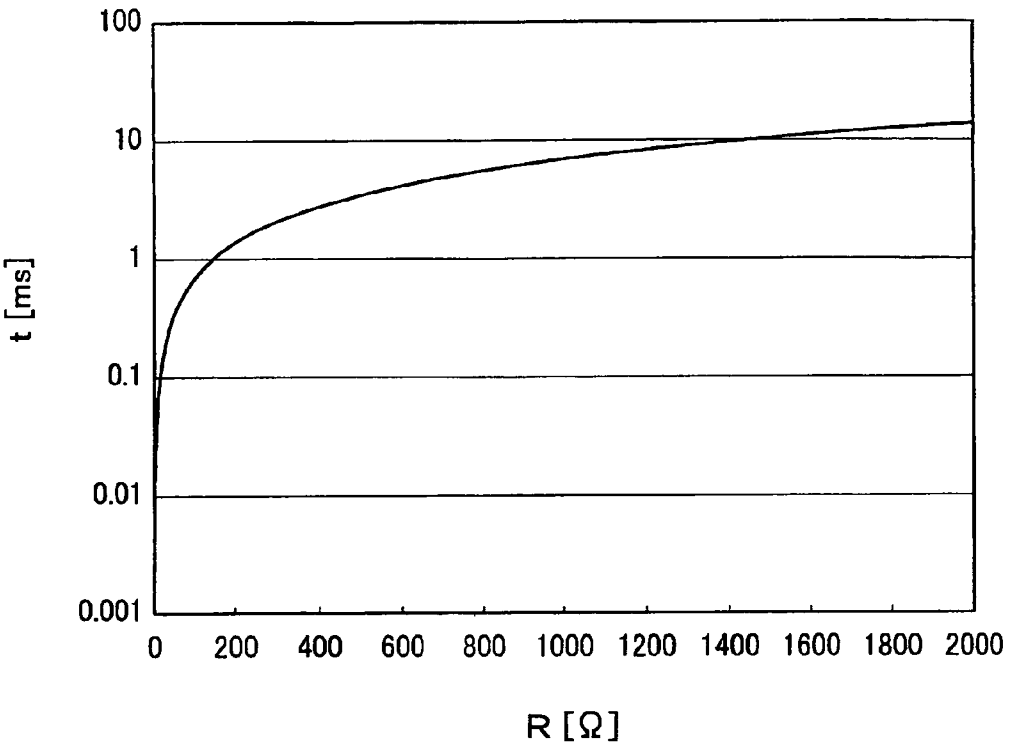
Fig. 26 PRIOR ART
FIG. 26 shows a relationship between resistance R and time t in the equivalent circuit shown in FIG. 25.

FIG. 6A shows the equivalent circuit when a voltage is applied only between the fixed electrode 12 and the connection pad 16*b*. In the case of FIG. 6A, only a low-resistance component LR is connected in series between a power supply PS and the capacitor C1, and a high-resistance component HR is connected in series between the power supply PS and the capacitor C2. Therefore, as described above with reference to FIGS. 25 and 26, although there is no problem in the charging characteristics of the capacitor C1, there is the problem that the charging time is lengthened in the capacitor C2.

Figure 6B:
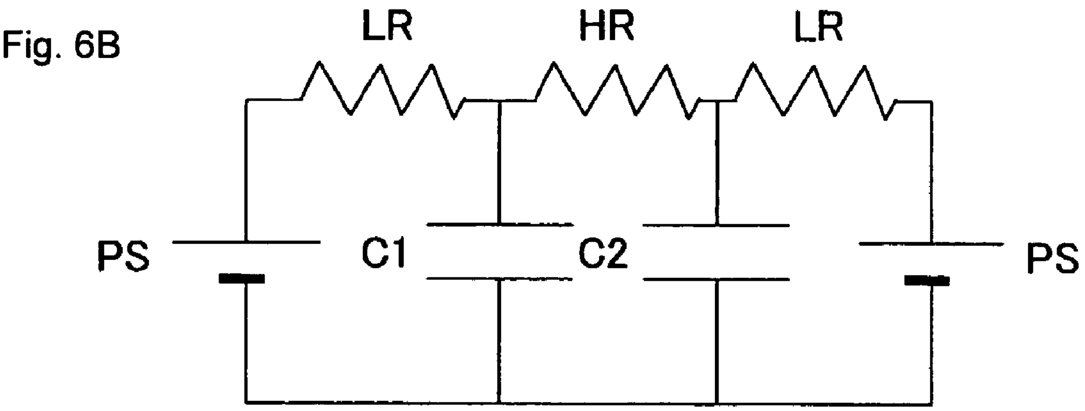
FIG. 6B shows an equivalent circuit when the voltage is applied between the fixed electrode and two connection pads.

On the other hand, FIG. 6B shows the equivalent circuit when the voltage is applied between the fixed electrode 12 and both the connection pad 16*b* and the connection pad 15*b*. In the case of FIG. 6B, similarly to the capacitor C1, the low-resistance component LR is connected in series between the power supply PS and the capacitor C2. Therefore, there is also no problem in the charging characteristics of the capacitor C2.

A method of producing the electrostatic micro switch 1 having the above configuration will be described below. Particularly, a method of forming the movable substrate 20 will be described in detail with reference to FIGS. 7 and 8. A general-purpose MEMS process or a general-purpose semiconductor production process can be utilized as the individual process technique, and it is not necessary to use the unique process.

Figures 7A, 7B, 7C, 7D, 7E, 7F:
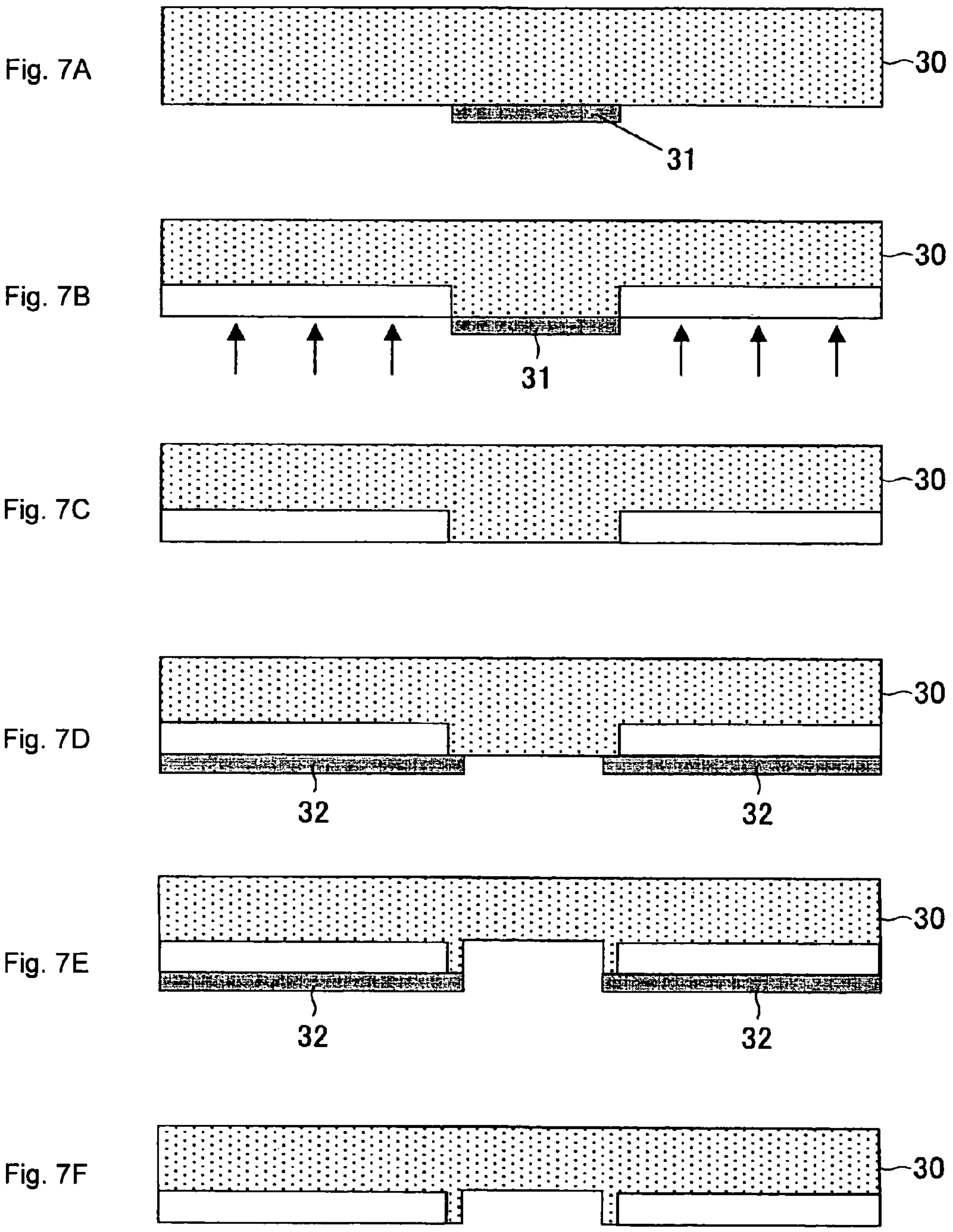
FIGS. 7A to 7F show a sectional view of an example of a movable substrate production process.

FIGS. 7A to 7F show an example of the method of producing the movable substrate 20. As shown in FIG. 7A, a high-resistivity semiconductor substrate 30 which becomes the movable substrate 20 is prepared, and a mask 31 is formed by an insulating film or the like in the region where the low resistivity is not necessary in the lower surface of the semiconductor substrate 30. As shown in FIG. 7B, the doping is performed by the ion implantation or the diffusion to the lower surface of the semiconductor substrate 30 to form the desired depth and region having the low resistivity. Then, as shown in FIG. 7C, the mask 31 is removed.

As shown in FIG. 7D, in order to adjust the thickness or to form a recess at the desired position by etching, a mask 32 is formed by the insulating film or the like in the region where the etching is not necessary. As shown in FIG. 7E, the etching is performed. As shown in FIG. 7F, the mask 32 is removed to complete the movable substrate 20. In the case where plural recesses are formed while the recesses have the different recesses, it is necessary that the proper mask be formed in each case to repeat the processes shown in FIGS. 7D to 7F.

Figures 8A, 8B, 8C, 8D, 8E, 8F, 8G:
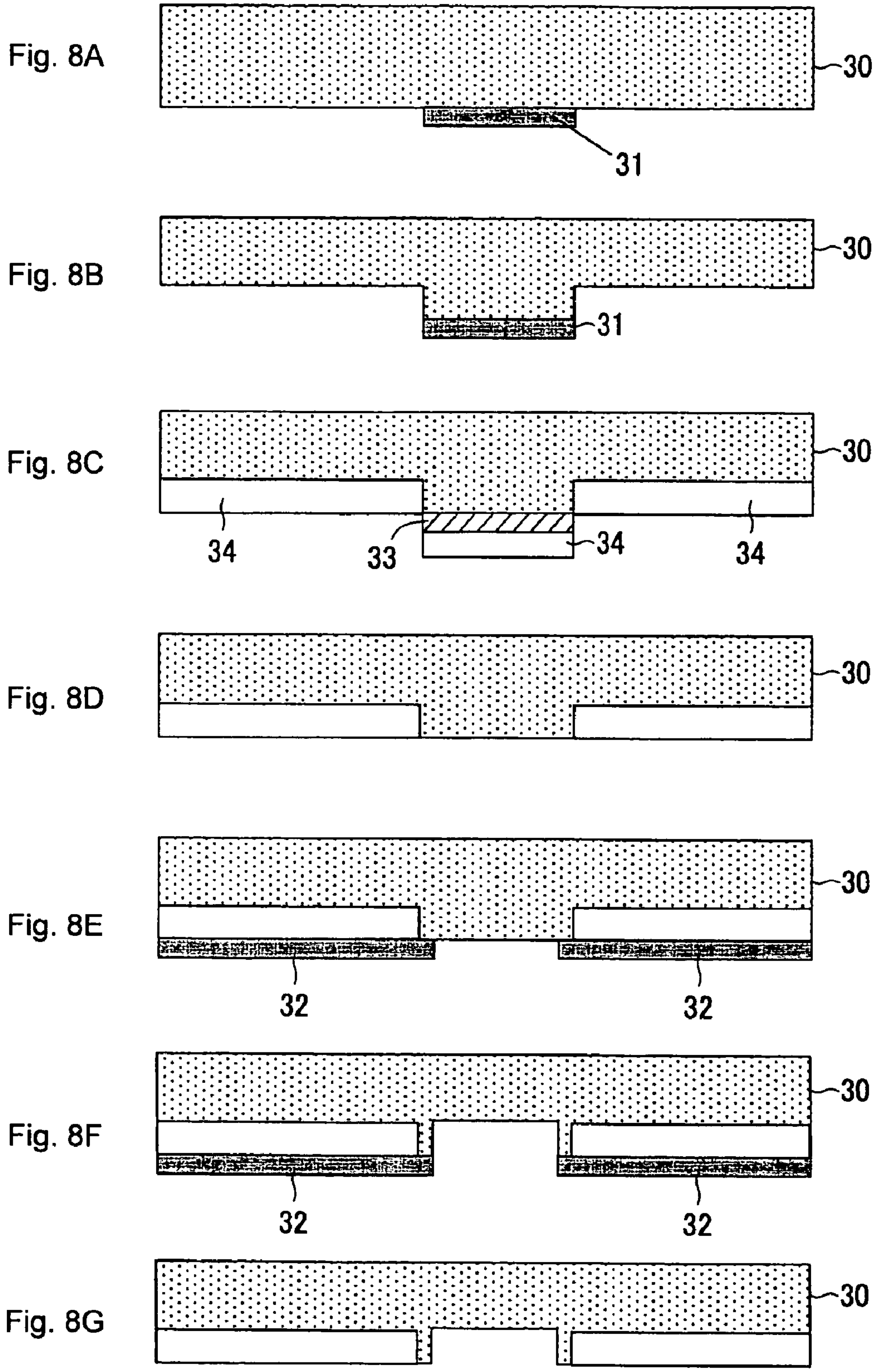
FIGS. 8A to 8G show a sectional view of another example of the movable substrate production process.

FIGS. 8A to 8G show another example of the method of producing the movable substrate 20. As shown in FIG. 8A, the high-resistivity semiconductor substrate 30 which becomes the movable substrate 20 is prepared, and the mask 31 is formed by the insulating film or the like in the region where the low resistivity is not necessary in the lower surface of the semiconductor substrate 30. As shown in FIG. 8B, the etching is performed to region where the low resistivity is necessary in the lower surface of the semiconductor substrate 30. After the mask 31 is removed, a sacrifice layer 33 is formed in the region where the low resistivity is not necessary. As shown in FIG. 8C, a low-resistivity semiconductor film 34 having the desired thickness is deposited by CVD (Chemical Vapor Deposition) or the like. As shown in FIG. 8D, the semiconductor substrate 30 in which the low-resistivity region is embedded is obtained by etching the sacrifice layer 33.

As shown in FIG. 8E, in order to adjust the thickness or to form the recess at the desired position by etching, the mask 32 is formed by the insulating film or the like in the region where the etching is not necessary. As shown in FIG. 8F, the etching is performed. As shown in FIG. 8G, the mask 32 is removed to complete the movable substrate 20. In the case where plural recesses are formed while the recesses have the different recesses, it is necessary that the proper mask be formed in each case to repeat the processes shown in FIGS. 8E to 8G.

After the contact portions and the like are formed in the movable substrate 20 produced in the above manner by the general purpose MEMS process, the movable substrate 20 is bonded to the fixed substrate 10 in which the interconnects and the like are formed. The movable electrode 23, the first elastic support portions 22, and 22 and the second support portions 24 and 24 are formed by photolithography and the etching, and the electrostatic micro switch 1 is completed.

Figure 9:
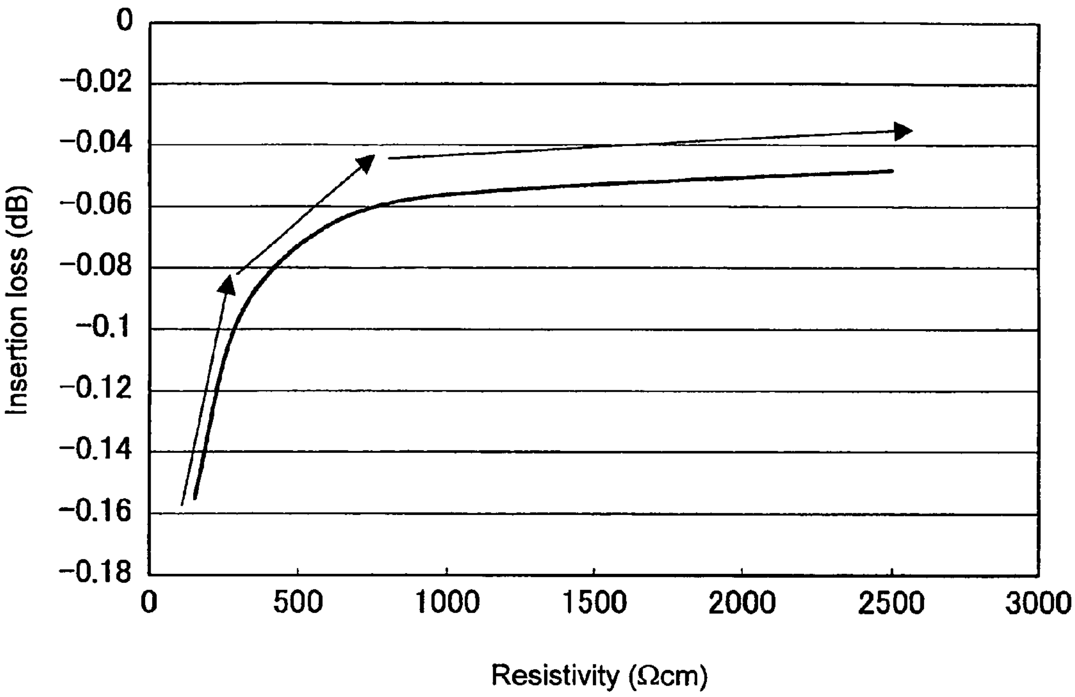
FIG. 9 shows a simulation result of studying a relationship between resistivity and insertion loss with respect to a semiconductor used as the movable substrate.

The ranges of the high-resistivity and the low-resistivity will be described below with reference to FIGS. 9 and 10. FIG. 9 is a graph showing a simulation result of studying a relationship between resistivity and insertion loss which one of high-frequency characteristics with respect to a semiconductor used as the movable substrate 20. The Model used in the simulation corresponds to the electrostatic micro switch 1 of the first embodiment, and numerical values indicating various characteristics are as follows.

That is, the material of the semiconductor substrate 30 is silicon, the thickness of the semiconductor substrate 30 is 20 μm, a relative dielectric constant of the semiconductor substrate 30 is 11.36, tan δ which is of the dielectric loss characteristic of the semiconductor substrate 30 is 0.013, the thickness of the movable contact 28 of the movable substrate 20 is 1 μm, the width of the movable contact 28 of the movable substrate 20 is 100 μm, the material of the fixed substrate 10 is Pyrex (registered trademark), the thickness of the fixed substrate 10 is 500 μm, the thicknesses of the fixed contacts 13*a* and 14*a* of the fixed substrate 10 are 2 μm, the widths of the fixed contacts 13*a* and 14*a* of the fixed substrate 10 are 300 μm, and the interval between the two fixed contacts 13*a* and 14*a* is 40 μm. Only one kind of the resistivity is used for the semiconductor substrate 30.

As can be seen from FIG. 9, the insertion loss is rapidly decreased up to the semiconductor resistivity of 300 Ωcm, saturation of the insertion loss is started at 800 Ωcm, and then the insertion loss is gently decrease. That is, for the high resistivity, it is desirable that the resistivity be not lower than 800 Ωcm.

Figure 10:
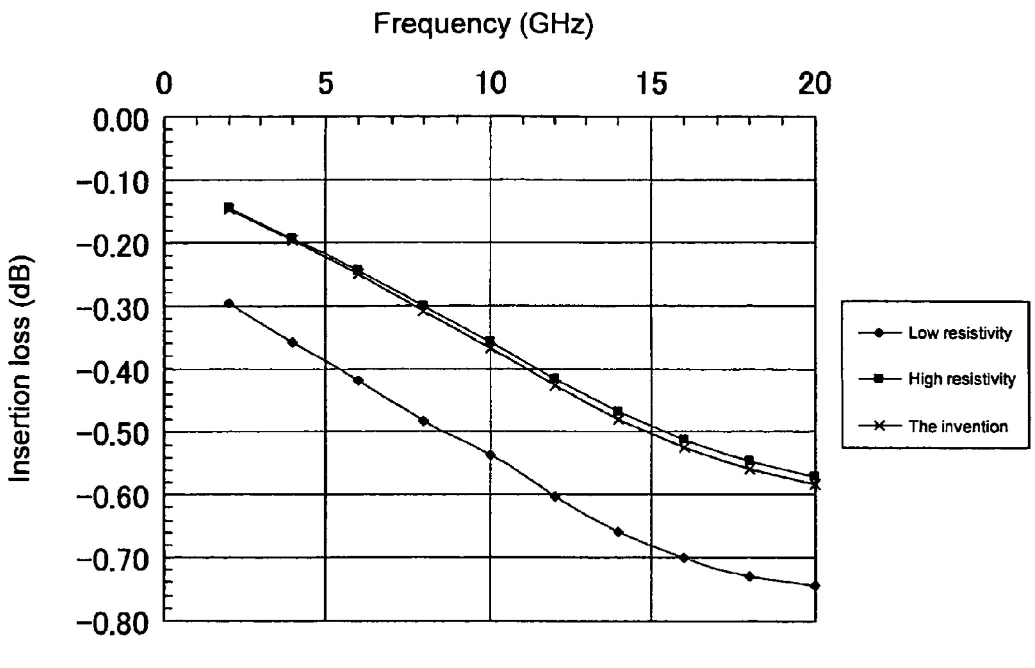
FIG. 10 shows a simulation result of studying a relationship between a frequency of a signal to be switched and the insertion loss in the electrostatic micro switch.

FIG. 10 is a graph showing a simulation result of studying a relationship between a frequency of a signal to be switched and the insertion loss in the electrostatic micro switch 1 of the first embodiment. In FIG. 10, a curve connecting x-marks indicates the first embodiment. In the first embodiment, as shown in FIGS. 3 and 4, the 800-Ωcm high-resistivity region is formed in the predetermined portion of the semiconductor which is of the movable substrate 20, and the 300-Ωcm low-resistivity region is formed in other portions. On the other hand, a curve connecting rhombic marks indicates a comparative example in which the 300-Ωcm low-resistivity region is formed in all the portions of the semiconductor which is of the movable substrate. A curve connecting square marks also indicates a comparative example in which the 800-Ωcm high-resistivity region is formed in all the portions of the semiconductor which is of the movable substrate. As can be seen from FIG. 10, the electrostatic micro switch 1 of the first embodiment has the excellent high-frequency characteristics similar to the case where the high-resistivity region is formed in all the portions of the semiconductor which is of the movable substrate.

As described above, in the movable substrate 20 of the first embodiment, the high-resistivity region HR is formed near the signal lines 13 and 14 through which the high-frequency signal is passed in the surface on the arrangement side of the fixed substrate 10 as shown in FIGS. 3 and 4. For the movable substrate 20 of the first embodiment, the region where the high-resistivity region HR is formed should cover how far the range from the region facing the signal lines 13 and 14 will be described with reference to FIGS. 11 and 12.

Figure 11A:
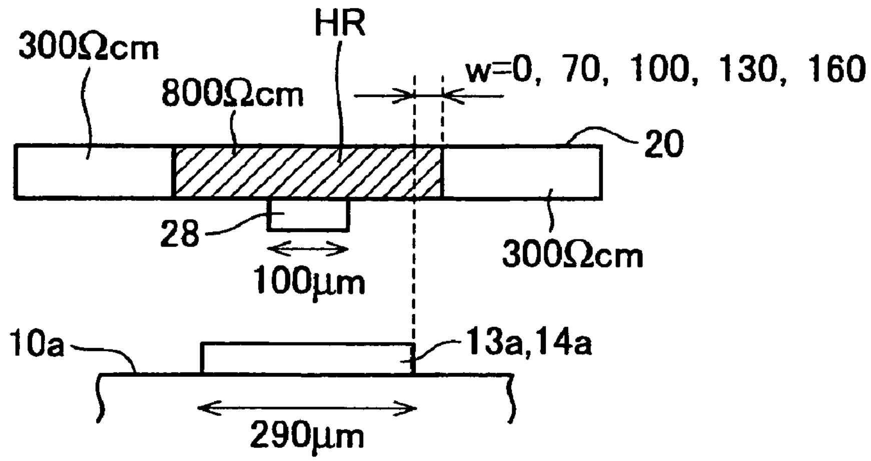
FIG. 11A shows a sectional view.
Figure 11B:
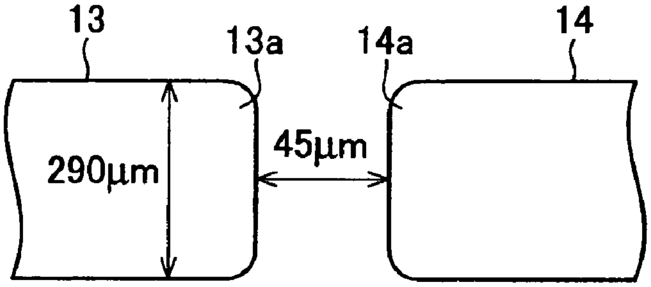
FIG. 11B shows a plan view.
Figure 12:
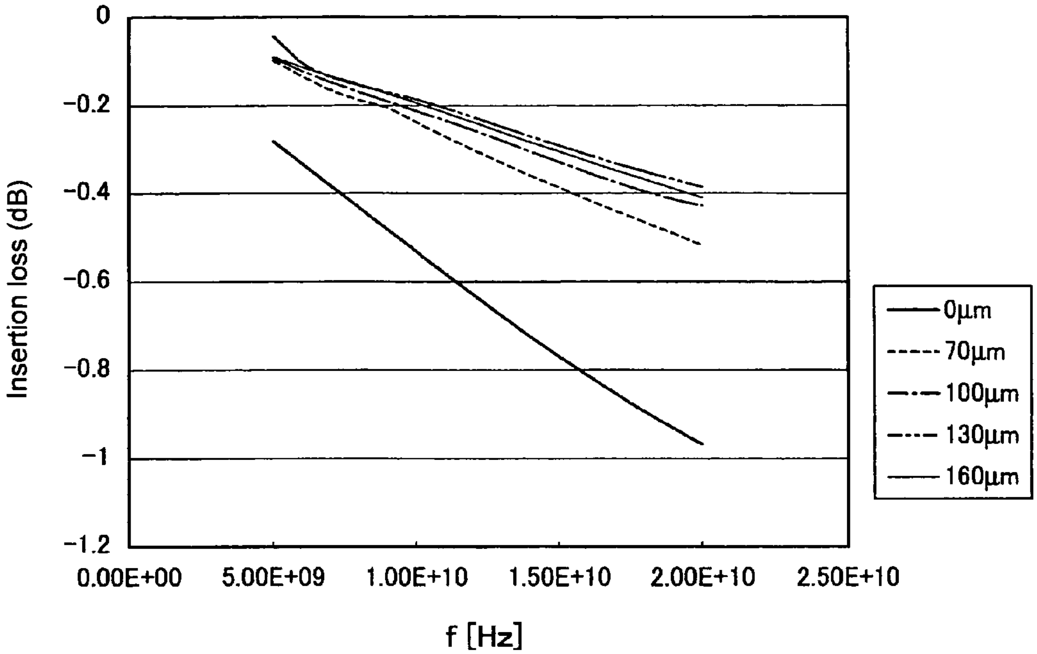
FIG. 12 shows a result of the simulation.

FIGS. 11 and 12 shows the simulation result of the study of the relationship between a frequency f of the signal to be turned on and off and the insertion loss when an area (width) of the high-resistivity region HR is changed in the electrostatic micro switch 1 of the first embodiment. FIG. 11A simply shows the movable substrate 20, the movable contact 28, the glass substrate 10*a*, and the fixed contacts 13*a* and 14*a* for the model utilized for the simulation. FIG. 11B shows the signal lines 13 and 14 such that the width, the interval, and the arrangement can be seen.

In the model the high resistivity is set at 800 Ωcm and the low resistivity is set at 300 Ωcm. As shown in FIG. 11A, in the movable substrate 20, the high-resistivity region HR is formed in the region which is enlarged from the region facing the signal lines 13 and 14 by a predetermined width W, and the simulation is performed in the case of the widths W of 0, 70, 100, 130, and 160 μm.

FIG. 12 is a graph showing the result of the simulation. As can be seen from FIG. 12, it is necessary that the high-resistivity region HR be formed in the region where the width W is enlarged not lower than 100 μm from the region facing the signal lines 13 and 14. This is attributed to the fact that an electric field generated by the high-frequency signal passed through the signal line propagates through a space near the signal line. Accordingly, even if the movable substrate 20 has any structure, it is found that the high-resistivity region is formed in the region enlarged not lower than 100 μm from the region facing the signal line through which the high-frequency signal is passed.

In the first embodiment, because the widths (290 μm) of the signal lines 13 and 14 located in the fixed substrate 10 is wider than the width (100 μm) of the movable contact 28 of the movable substrate 20, the high-resistivity region HR is determined while the region facing the signal lines 13 and 14 is set at the reference region. However, in the case where the width of the movable contact 28 is wider than the widths of the signal lines 13 and 14, the high-resistivity region HR may be determined while the regions of signal lines 13 and 14 are set at the reference region.

Figure 13:
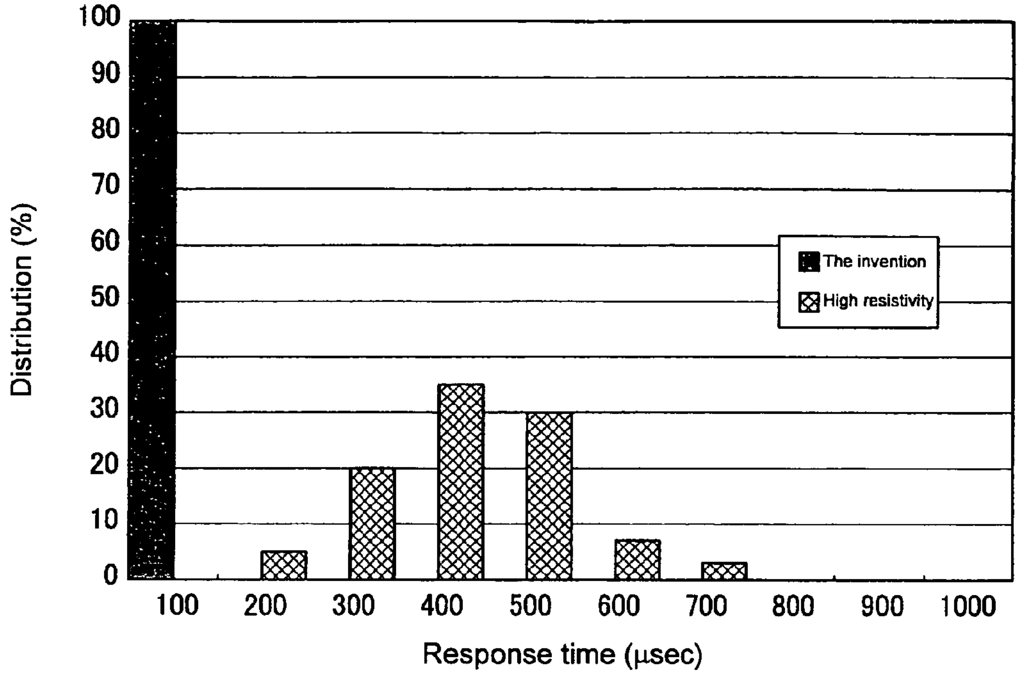
FIG. 13 shows a distribution of response time when the electrostatic micro switch is driven.

A response time of the electrostatic micro switch 1 of the first embodiment will be described with reference to FIG. 13. FIG. 13 shows a distribution of the response time when the electrostatic micro switch is driven. In FIG. 13, a gray bar graph indicates the first embodiment. In the first embodiment, as shown in FIGS. 3 and 4, the 800-Ωcm high-resistivity region is formed in the predetermined portion of the semiconductor which is of the movable substrate 20, and the 300-Ωcm low-resistivity region is formed in other portions. On the other hand, a hatched bar graph indicates a comparative example in which the 800-Ωcm high-resistivity region is formed in all the portions of the semiconductor which is of the movable substrate.

As can be seen from FIG. 13, when the high-resistivity region is formed in all the portions of the semiconductor which is of the movable substrate, the response time is lengthened due to influences such as the formation of the depletion layer and the charging characteristics of the CR circuit. On the contrary, in the electrostatic micro switch 1 of the first embodiment, since the low-resistivity region is formed in the portions where the drive voltage is applied, the formation of the depletion layer and the charging characteristics of the CR circuit have the small influence on the electrostatic micro switch 1, which results in the response time as short as 100 μsec or less.

Thus, it can be understood that the electrostatic micro switch 1 of the first embodiment has the little insertion loss and the excellent high-frequency characteristics while the drive voltage rise and the response speed lowering never occur.

It is desirable that the required thickness of the low-resistivity region be determined by the thickness of the depletion layer 90 and the charging characteristics of the CR circuit. The thickness of the depletion layer 90 is generated in the movable substrate 20 when the voltage is applied to the movable substrate 20 and the fixed electrode 10. The CR circuit is formed by the total resistance value R of the movable substrate 20 and the capacitance C between the movable substrate 20 and the fixed electrode 12.

The thickness of the depletion layer 90 is determined by a threshold voltage of the MIS structure modeled by the movable substrate 20 and the fixed electrode 12, the resistivity of the movable substrate 20, the dielectric constant of vacuum, and the like. The threshold voltage of the MIS structure is determined by sizes such as an area of a structure and a gap. The total resistance value R of the movable substrate 20 is determined by the resistivity and distribution of the movable substrate 20, a volume of the movable substrate 20, and the like. Accordingly, it is necessary to design the required thickness of the low-resistivity region in consideration of various features such as the material and structure of the movable substrate 20 and the positional relationship between the movable substrate 20 and the fixed electrode 12.

A boundary between the low-resistivity region and the high-resistivity region is clear in the first embodiment. As long as the thickness of the region and the resistivity are properly set, it is obvious that the same effect is obtained even in the case where the resistivity is gradually changed at the boundary.

Second Embodiment

A second embodiment of the invention will be described below with reference to FIG. 14. The electrostatic micro switch 1 according to the second embodiment differs from the electrostatic micro switch 1 of the first embodiment shown in FIGS. 1 to 5 only in the high-resistivity and the low-resistivity regions in the movable substrate 20. In other configurations, the electrostatic micro switch 1 of the second embodiment is similar to the electrostatic micro switch 1 of the first embodiment. In the electrostatic micro switch 1 of the second embodiment, the component having the same function as the first embodiment is designated by the same numeral as the first embodiment, and the description will not be given.

Figure 14A:
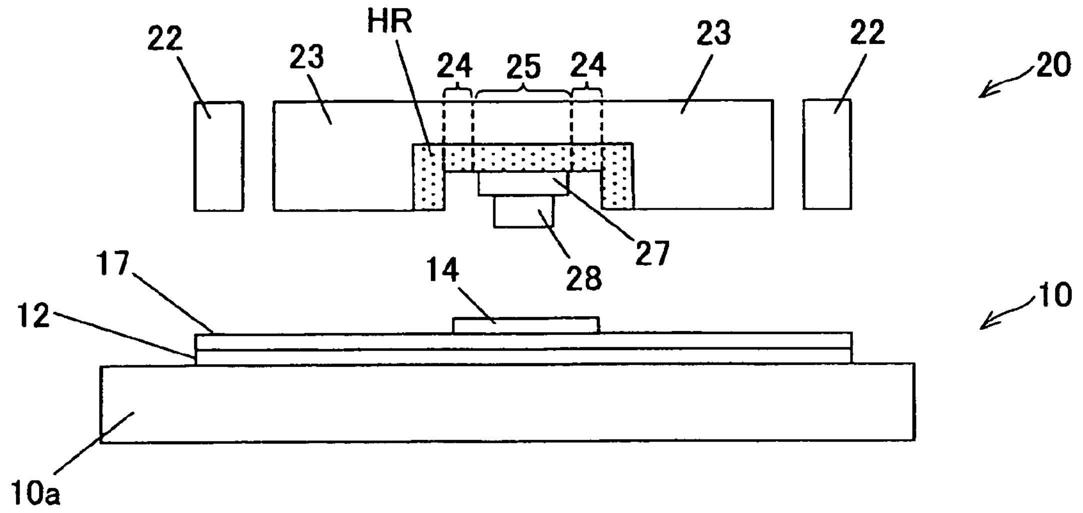
FIG. 14A shows a sectional view.
Figure 14B:
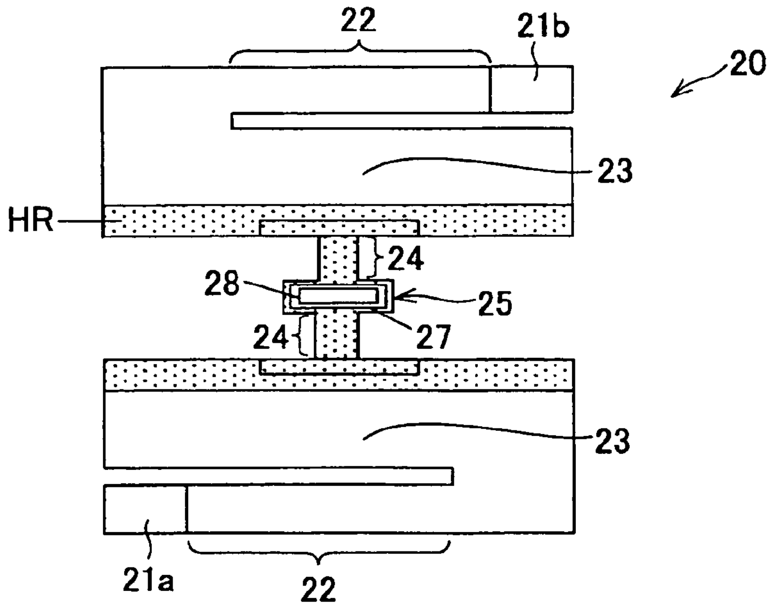
FIG. 14B shows a lower surface view of the movable substrate in the electrostatic micro switch.

FIG. 14 shows a structure of the electrostatic micro switch 1 of the second embodiment, and FIGS. 14A and 14B correspond to FIGS. 3 and 4 respectively. Referring to FIG. 14, in the movable substrate 20 of the second embodiment, the high-resistivity region HR is formed only near the signal lines 13 and 14 through which the high-frequency signal are passed, and the low-resistivity region is formed in other regions. The movable substrate 20 of the second embodiment can be produced by preparing the low-resistivity semiconductor substrate to form the high-resistivity semiconductor film in a predetermined region on the semiconductor substrate.

The same effect as the first embodiment can be obtained even in the electrostatic micro switch 1 of the second embodiment. The width and height of the high-resistivity region HR can be determined by performing the simulation shown in FIGS. 11 and 12.

Third Embodiment

A third embodiment of the invention will be described below with reference to FIG. 15. The electrostatic micro switch 1 according to the third embodiment differs from the electrostatic micro switch 1 of the first embodiment shown in FIGS. 1 to 5 only in the high-resistivity and the low-resistivity region in the movable substrate 20. In other configurations, the electrostatic micro switch 1 of the third embodiment is similar to the electrostatic micro switch 1 of the first embodiment. In the electrostatic micro switch 1 of the third embodiment, the component having the same function as the first embodiment is designated by the same numeral as the first embodiment, and the description will not be given.

Figure 15A:
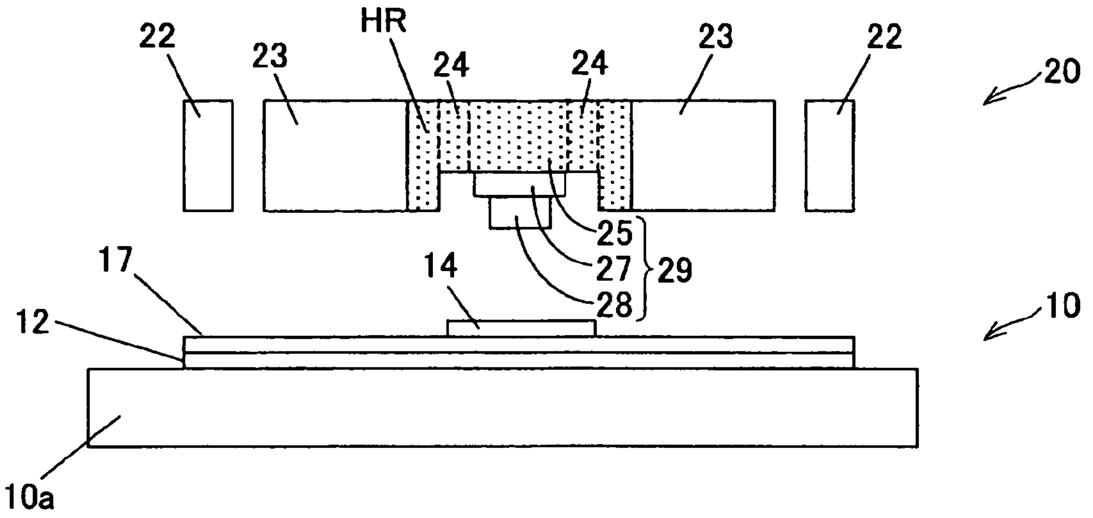
FIG. 15A shows a sectional view.
Figure 15B:
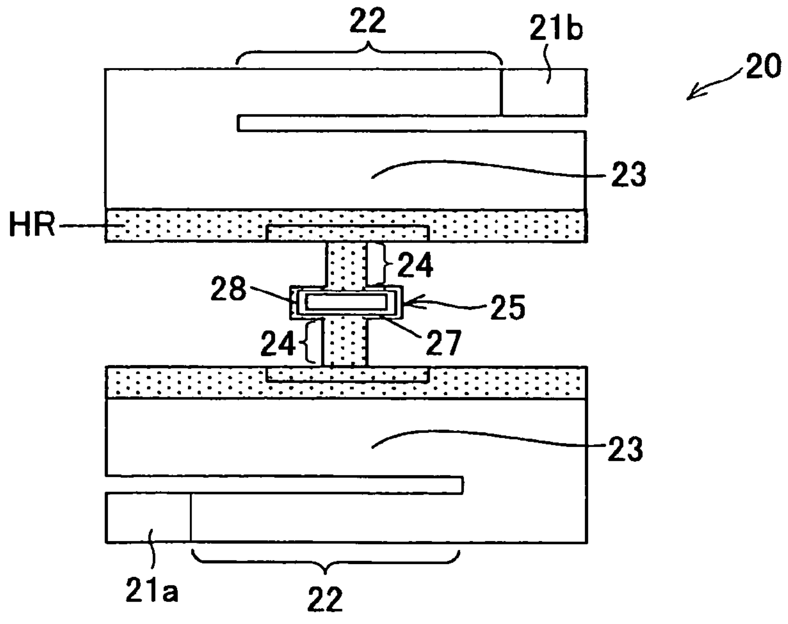
FIG. 15B shows a lower surface view of the movable substrate in the electrostatic micro switch.

FIG. 15 shows a structure of the electrostatic micro switch 1 of the third embodiment, FIGS. 15A and 15B correspond to FIGS. 3 and 4, respectively. Referring to FIG. 15, in the movable substrate 20 of the third embodiment, the high-resistivity region HR is formed from the region near the signal lines 13 and 14 through which the high-frequency signal are passed in the lower surface to the corresponding region in the upper surface, and the low-resistivity region is formed in other regions. The movable substrate 20 of the third embodiment can be produced by utilizing a bonded semiconductor substrate in which a high-resistivity semiconductor substrate is sandwiched by two low-resistivity semiconductor substrates.

The same effect as the above embodiments can be obtained in the third embodiment. Further, production period shortening and production cost reduction can be realized because the resistivity control by the doping shown in FIG. 7 or the semiconductor film formation shown in FIG. 8 is not required. In the third embodiment, similarly to the above embodiments, in order to generate more evenly the electrostatic attraction in the planes facing each other in the movable electrode 23 and the fixed electrode 12, it is desirable that the voltage be applied to both the connection pads 15*b* and 16*b* of the fixed substrate 10 electrically connected to the movable electrode 23.

Fourth Embodiment

A fourth embodiment of the invention will be described below with reference to FIG. 16. The electrostatic micro switch 1 according to the fourth embodiment differs from the electrostatic micro switch 1 of the third embodiment shown in FIG. 15 only in that the notch portions 26*a* and 26*b* are not formed toward the central portions from the both side-edge portions of the movable substrate 20. In other configurations, the electrostatic micro switch 1 of the fourth embodiment is similar to the electrostatic micro switch 1 of the third embodiment. In the electrostatic micro switch 1 of the fourth embodiment, the component having the same function as the third embodiment is designated by the same numeral as the third embodiment, and the description will not be given.

Figure 16A:
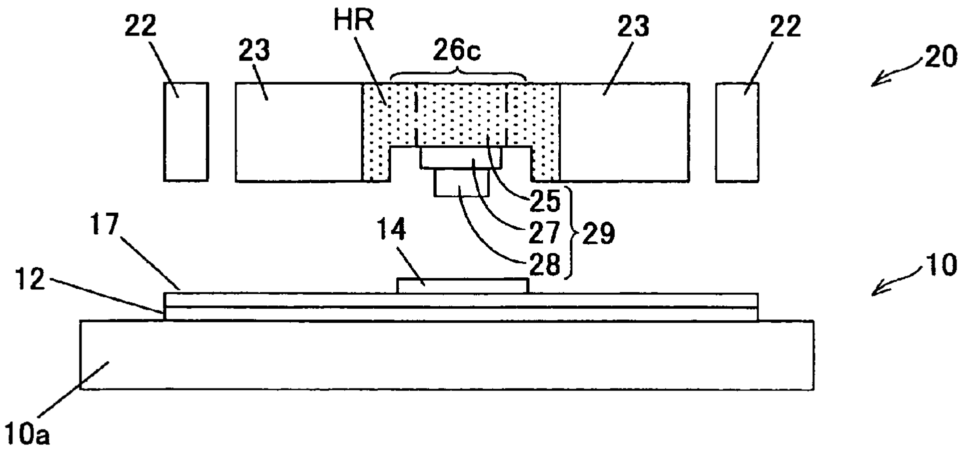
FIG. 16A shows a sectional view.
Figure 16B:
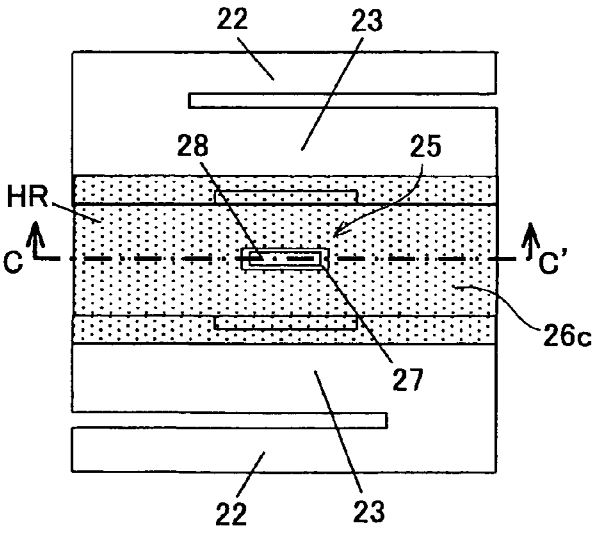
FIG. 16B shows a lower surface view of the movable substrate in the electrostatic micro switch.
Figure 16C:
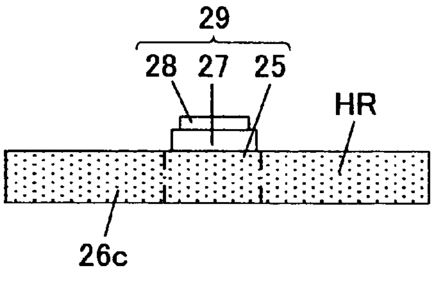
FIG. 16C shows a sectional view taken on line C-C' of FIG. 16B.

FIG. 16 shows a structure of the electrostatic micro switch of the fourth embodiment, FIGS. 16A and 16B correspond to FIGS. 15A and 15B. FIG. 16C shows a sectional view taken on line C-C' of FIG. 16B. Referring to FIG. 16, in the movable substrate 20 of the fourth embodiment, when compared with the movable substrate 20 shown in FIG. 15, the notch portions 26*a* and 26*b* are not formed toward the central portions from the both side-edge portions of the movable substrate 20, but a recess 26*c* is formed.

The recess 26*c* faces the signal lines 13 and 14 and the recess 26*c* has the high resistivity, so that the excellent high-frequency characteristics with little insertion loss can be maintained. Since the notch portions 26*a* and 26*b* are not provided, not only rigidity is improved to enhance strength of the movable substrate 20, but also the influence of residual stresses of the insulating film 27 formed in the movable substrate 20, the film of the movable contact 28, and the like is decreased. Therefore, the influence of warping is decreased to improve dimensional accuracy.

In the above embodiments, in the electrostatic micro switch 1, the switching is performed by bringing the contacts into contact with each other. However, it is obvious that the same effect is obtained, even if the invention is applied to the electrostatic micro switch disclosed in Japanese Patent Laid-Open No. 2003-258502 (Published Sep. 12, 2003) in which the switching is performed by the change in electrostatic capacitance.

Fifth Embodiment

Figure 17:
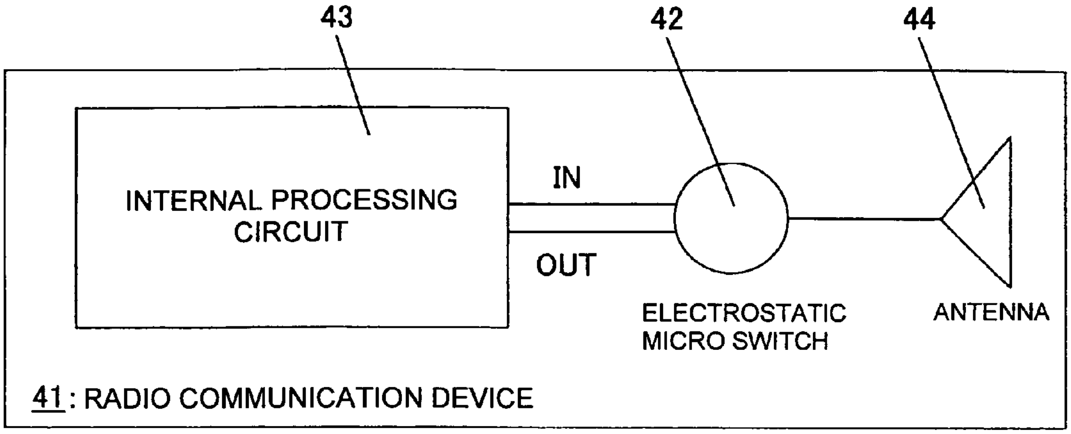
FIG. 17 shows a block diagram of a schematic configuration of a radio communication device according to still another embodiment of the invention.

A fifth embodiment of the invention will be described below with reference to FIG. 17. FIG. 17 shows a schematic configuration of a radio communication device 41 according to the fifth embodiment. In the radio communication device 41, an electrostatic micro switch 42 is connected between an internal processing circuit 43 and an antenna 44. Turning on or off the electrostatic micro switch 42 enables the internal processing circuit 43 to switch the state in which the signal is transmitted or received through the antenna 44 and the state in which the signal is not transmitted or received. In the fifth embodiment, the electrostatic micro switch 1 shown in FIGS. 1 to 16 is utilized as the electrostatic micro switch 42. Therefore, the electrostatic micro switch 42 can be suppress the insertion loss of the high-frequency signal transmitted or received by the internal processing circuit 43 while the drive voltage rise and the response speed lowering are not generated.

Sixth Embodiment

Figure 18:
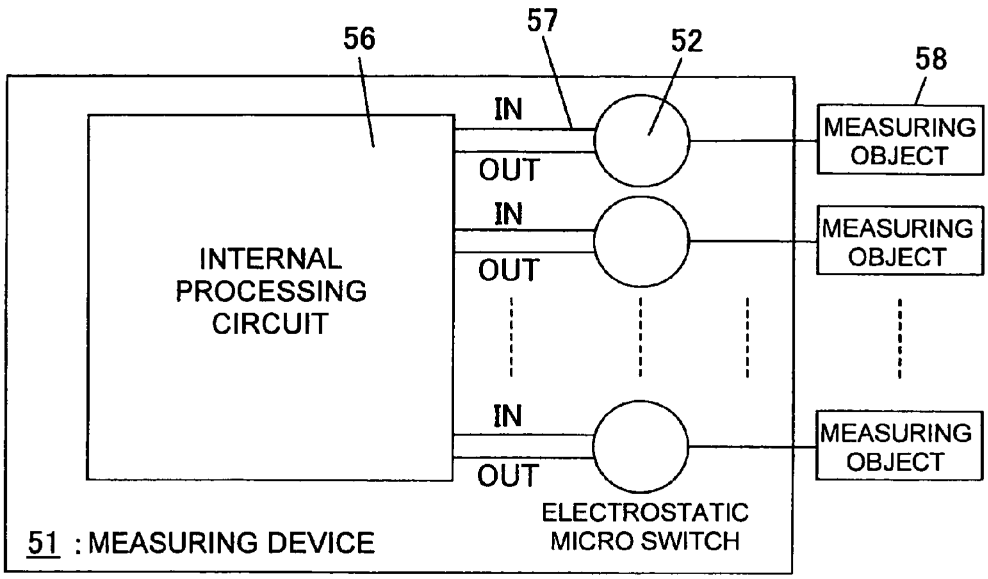
FIG. 18 shows a block diagram of a schematic configuration of a measuring device according to still another embodiment of the invention.

A sixth embodiment of the invention will be described below with reference to FIG. 18. FIG. 18 shows a schematic configuration of a measuring device 51 according to the sixth embodiment. In the measuring device 51, plural electrostatic micro switches 52 are connected in midpoints of plural signal lines 57 from one internal processing circuit 56 to plural measuring objects 58. Turning on or off each of the electrostatic micro switches 52 enables the internal processing circuit 56 to switch the measuring objects 58 to be transmitted or received.

In the sixth embodiment, the electrostatic micro switch 1 shown in FIGS. 1 to 16 is utilized as the electrostatic micro switch 52. Therefore, the electrostatic micro switch 52 can be suppress the insertion loss of the high-frequency signal transmitted or received by the internal processing circuit 56 while the drive voltage rise and the response speed lowering are not generated.

Seventh Embodiment

Figure 19:
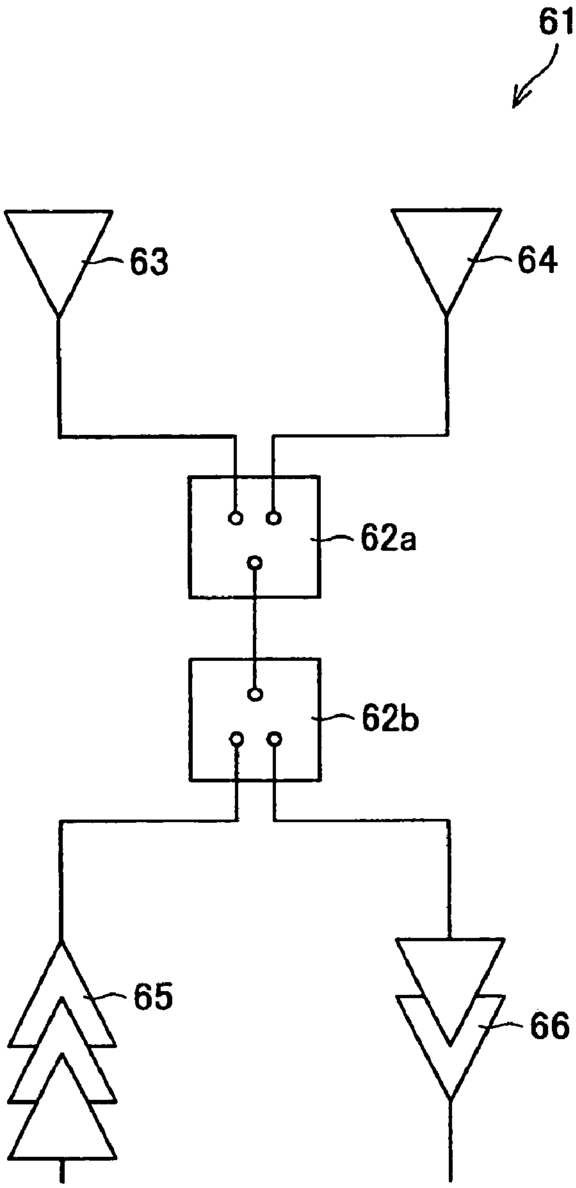
FIG. 19 shows a circuit diagram of a main-part configuration of a handheld terminal according to still another embodiment of the invention.
Figure 20A:
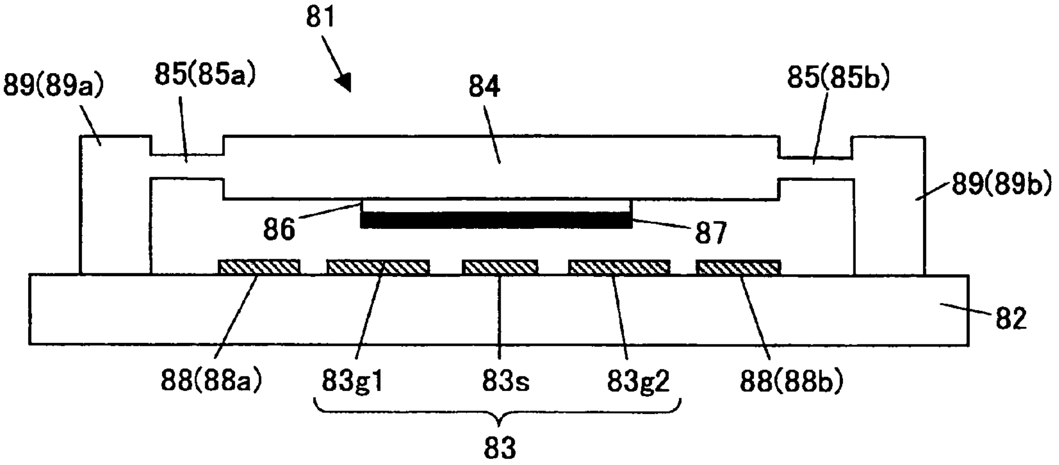
FIG. 20A shows a state in which the voltage is not applied between a movable body and a fixed electrode for moving in the RF-MEMS element.
Figure 20B:
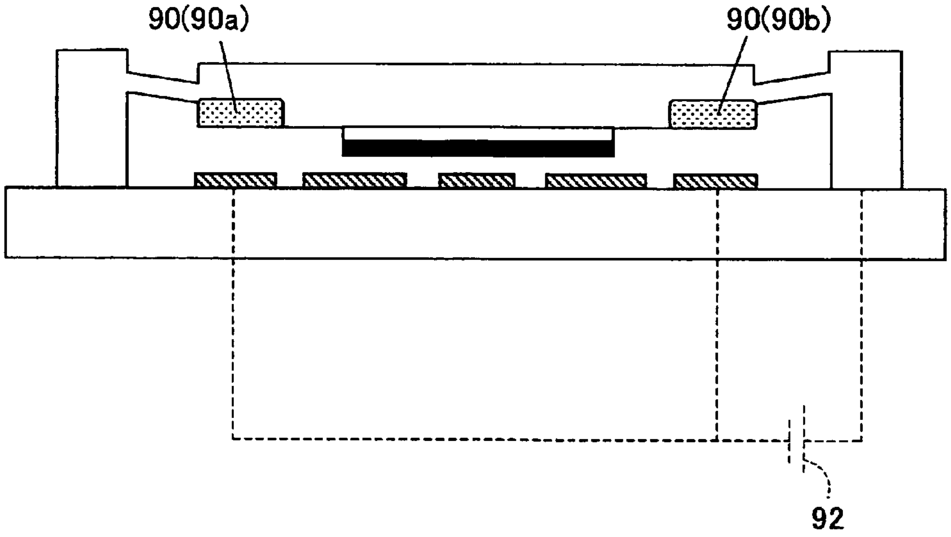
FIG. 20B shows a state in which the voltage is applied.
Figure 21A:
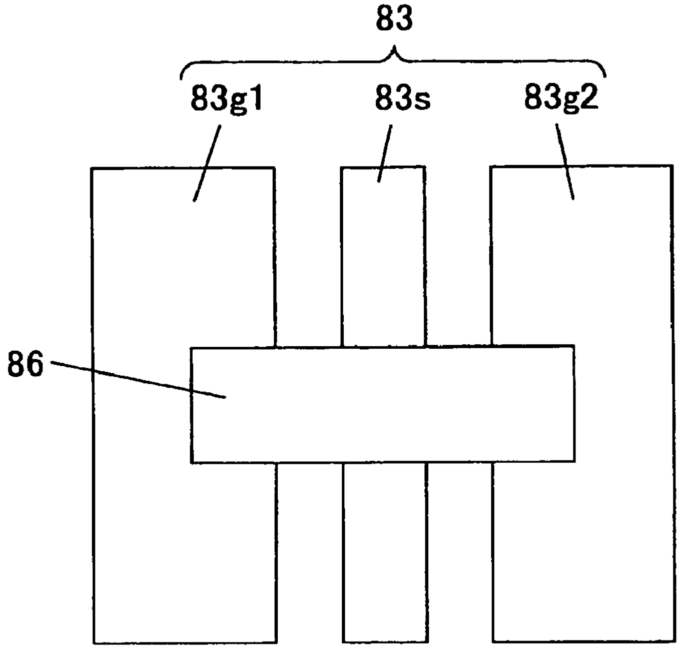
FIG. 21A shows a plan view.
Figure 21B:
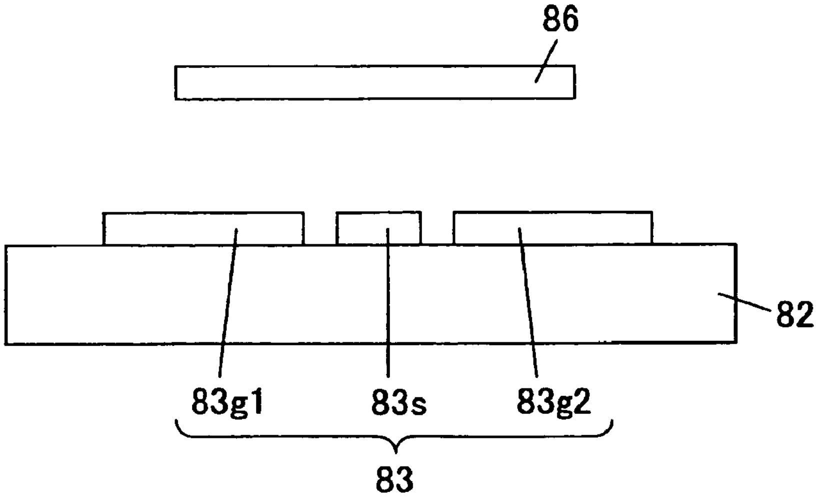
FIG. 21B shows a sectional view.
Figure 22A:
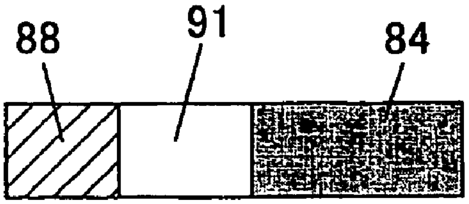
FIG. 22A shows modeling of a state in which the voltage is not applied between the movable body and the fixed electrode for moving.
Figure 22B:
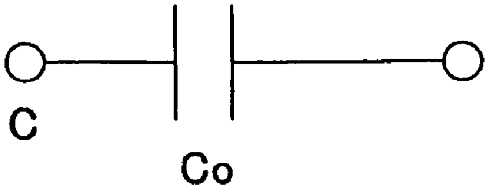
FIG. 22B shows an equivalent circuit of the modeling.
Figure 23A:
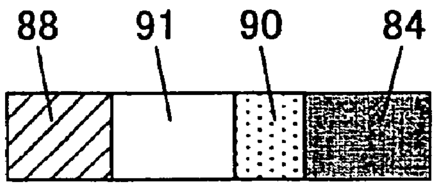
FIG. 23A shows modeling of a state in which the voltage is applied between the movable body and the fixed electrode for moving.
Figure 23B:
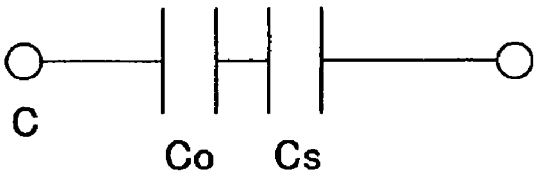
FIG. 23B shows an equivalent circuit of the modeling.
Figure 24:
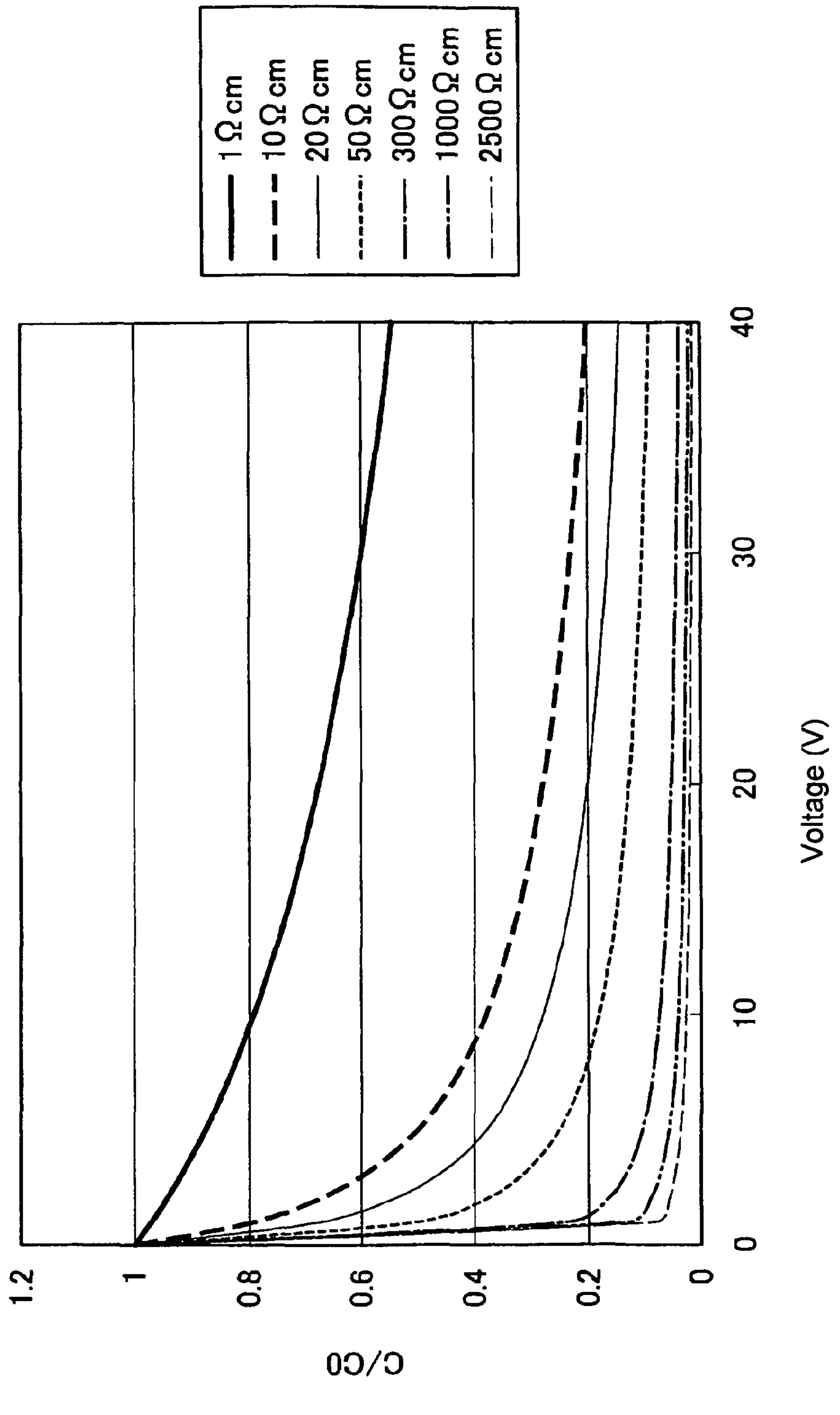
Fig. 24 PRIOR ART
FIG. 24 shows a relationship between a ratio of C/Co and the applied voltage when resistivity of a silicon semiconductor is variously changed in the equivalent circuit shown in FIG. 23B.

A seventh embodiment of the invention will be described below with reference to FIG. 19. FIG. 19 shows a main-part configuration of a handheld terminal 61 according to the seventh embodiment. In the handheld terminal 61, two electrostatic micro switches 62*a* and 62*b* are utilized. The electrostatic micro switch 62*a* performs a function of switching an internal antenna 63 and an outer antenna 64, and the electrostatic micro switch 62*b* perform a function of switching signal flow between an electric power amplifier 65 on the transmission circuit side and a low-noise amplifier 66 on the reception circuit side.

In the sixth embodiment, the electrostatic micro switch 1 shown in FIGS. 1 to 16 is utilized as the electrostatic micro switches 62*a* and 62*b*. Therefore, the electrostatic micro switches 62*a* and 62*b* can be suppress the insertion loss of the high-frequency signal, which is transmitted by the electric power amplifier 65 and received by the low-noise amplifier 66, while the drive voltage rise and the response speed lowering are not generated.

As described above, the electrostatic micro switch according to the invention can pass through the signal ranging from the direct-current signal to the high-frequency signal with low loss while maintaining the stable characteristics for a long time. Accordingly, the adoption of the electrostatic micro switch of the invention to the radio communication device 41, the measuring device 51, and the handheld terminal 61 enables the signal to be accurately transmitted for a long time while the load onto the amplifier used in the internal processing circuit or the like is suppressed. Further, the electrostatic micro switch of the invention is small and power consumption is also small, so that the effectiveness is exerted particularly in the battery-powered devices such as the radio communication device and handheld terminal and in the case where the plural measuring devices are used.

In the above embodiments, the resistivity is set at 300 Ωcm in the low-resistivity portion of the semiconductor which is of the movable substrate 20. From the viewpoint of response speed, it is preferable that the resistivity of the low-resistivity portion be lowered as much as possible. For example, because the resistivity ranges from 3 to 4 Ωcm in the semiconductor usually used in the MEMS element, the semiconductor usually used in the MEMS element may be used as the low-resistivity portion.

The invention is not limited to the above embodiments, but various changes could be made without departing from the scope shown in claims. Another embodiment obtained by appropriately combining technical means disclosed in the different embodiments is also included in the technical range of the invention.

Thus, in the electrostatic micro switch according to the invention, the drive voltage rise can be avoided, the operation speed lowering can be prevented, and the good high-frequency characteristics can be maintained. Therefore, the electrostatic micro switch of the invention can be applied to other MEMS elements in which the high-frequency signal is utilized.

What is claimed is:

1. A MEMS element comprising:

a fixed electrode disposed on a fixed substrate; and a movable substrate elastically supported by the fixed substrate, the movable substrate including a movable electrode facing the fixed electrode;

wherein the movable electrode is elastically supported by the fixed substrate through an elastic support portion disposed between the movable electrode and the fixed substrate, wherein the movable substrate electrode comprises a semiconductor including a plurality of regions having different values of resistivity; and wherein the movable electrode comprises a region of high resistivity disposed between two regions of low resistivity.

2. The MEMS element according to claim 1, further comprising:

a fixed-side signal conducting unit disposed on the fixed substrate; and a movable-side signal conducting unit disposed on the movable substrate, wherein a region of high resistivity is disposed near the movable-side signal conducting unit.

3. The MEMS element according to claim 2, wherein a region of low resistivity is disposed at a periphery of the region of high resistivity of the movable electrode.

4. The MEMS element according to claim 3, wherein the region of high resistivity at the periphery of the region of high resistivity near the movable electrode extends at least 100 μm away from the periphery.

5. The MEMS element according to claim 2, wherein the movable electrode is etched to form a cut-out portion around the movable-side signal conducting unit.

6. The MEMS element according to claim 1, wherein the movable substrate is formed by disposing a low-resistivity semiconductor region on a high-resistivity semiconductor substrate.

7. The MEMS element according to claim 1, wherein the movable electrode further comprises a low-resistivity region, and wherein the low-resistivity region of the movable electrode is formed by doping.

8. The MEMS element according to claim 1, wherein the high resistivity is not lower than 800 Ωcm.

9. The MEMS element according to claim 1, wherein the movable electrode further comprises a low-resistivity region, and wherein the low resistivity is not more than 300 Ωcm.

10. The MEMS element according to claim 1, wherein a low-resistivity semi-conductor region is disposed on a high-resistivity semiconductor substrate to dispose the region of high resistivity near the movable electrode.

11. The MEMS element according to claim 1, wherein a high-resistivity semi-conductor region is disposed on a low-resistivity semiconductor substrate to dispose the region of high resistivity near the movable electrode.

12. The MEMS element according to claim 1, wherein the MEMS element is an electrostatic micro switch.

13. The MEMS element according to claim 1, wherein the MEMS element is disposed in a measuring device.

14. The MEMS element according to claim 1, wherein the MEMS element is disposed in a handheld device.

15. A radio communication device comprising:

an antenna;

an internal processing circuit; and a MEMS element connected between the antenna and the internal processing circuit, the MEMS element comprising:

a fixed electrode disposed on a fixed substrate; and a movable substrate elastically supported by the fixed substrate, the movable substrate including a movable electrode facing the fixed electrode;

wherein the movable electrode is elastically supported by the fixed substrate through an elastic support portion disposed between the movable electrode and the fixed substrate, wherein the movable electrode substrate comprises a semiconductor including a plurality of regions having different values of resistivity, and wherein the movable electrode comprises a region of high resistivity disposed between two regions of low resistivity.

16. A method of producing a MEMS element comprising a fixed electrode disposed on a fixed substrate, and a movable electrode disposed on a movable substrate, wherein the movable substrate is elastically supported by the fixed substrate through an elastic support portion disposed between the movable electrode and the fixed substrate, and wherein the movable substrate electrode comprises a plurality of different resistivity regions, the method comprising: disposing a high resistivity region between two regions of low resistivity on at least a portion of the movable electrode.

17. The method according to claim 16, wherein the disposing of the high-resistivity region near the movable electrode comprises: forming a low-resistivity region on a part of a high-resistivity semiconductor substrate.

18. The method according to claim 16, wherein the disposing of the high-resistivity region comprises: forming a high-resistivity region on a low-resistivity semiconductor substrate.

19. The method according to claim 16, wherein the disposing of the high-resistivity region comprises doping or CVD.

20. The method according to claim 16, wherein the disposing of the high-resistivity region comprises: machining the movable substrate to form a cut-out portion around a movable-side signal conducting unit.

* * * * *